United States Patent
Chou

(10) Patent No.: US 7,101,724 B2
(45) Date of Patent: Sep. 5, 2006

(54) METHOD OF FABRICATING SEMICONDUCTOR DEVICES EMPLOYING AT LEAST ONE MODULATION DOPED QUANTUM WELL STRUCTURE AND ONE OR MORE ETCH STOP LAYERS FOR ACCURATE CONTACT FORMATION

(75) Inventor: Chia-Shing Chou, Oak Park, CA (US)

(73) Assignee: Wireless MEMs, Inc., Oak Park, CA (US)

( * ) Notice: Subject to any disclaimer, the term of this patent is extended or adjusted under 35 U.S.C. 154(b) by 153 days.

(21) Appl. No.: 10/994,703

(22) Filed: Nov. 20, 2004

(65) Prior Publication Data

US 2005/0184836 A1   Aug. 25, 2005

Related U.S. Application Data

(63) Continuation-in-part of application No. 10/783,772, filed on Feb. 20, 2004.

(51) Int. Cl.
*H01L 21/20* (2006.01)
(52) U.S. Cl. ............................... 438/48; 438/52; 216/2
(58) Field of Classification Search ............ 438/48–53; 216/2, 13, 83, 99, 57; 257/415, 419
See application file for complete search history.

(56) References Cited

U.S. PATENT DOCUMENTS

| | | | |
|---|---|---|---|
| 5,121,089 A | 6/1992 | Larson | |
| 5,258,591 A | 11/1993 | Buck | |
| 5,578,976 A | 11/1996 | Yao | |
| 5,629,565 A | 5/1997 | Schlaak et al. | |
| 5,638,946 A | 6/1997 | Zavracky | |
| 6,046,659 A | 4/2000 | Loo et al. | |
| 6,331,257 B1 | 12/2001 | Loo et al. | |
| 6,384,353 B1* | 5/2002 | Huang et al. | 200/181 |
| 6,426,237 B1* | 7/2002 | Jech et al. | 438/48 |
| 6,667,245 B1* | 12/2003 | Chow et al. | 438/723 |
| 6,803,559 B1 | 10/2004 | Hsu et al. | |
| 6,842,097 B1 | 1/2005 | Hsu et al. | |
| 6,872,319 B1* | 3/2005 | Tsai | 216/2 |
| 6,903,637 B1* | 6/2005 | Miyazaki et al. | 335/78 |
| 2004/0091197 A1* | 5/2004 | Tonomura et al. | 385/14 |
| 2005/0002079 A1* | 1/2005 | Novotny et al. | 359/245 |

OTHER PUBLICATIONS

Petersen, K.E. 1978, "Dynamic micromechanics on silison: techniques and devices."
Petersen, K.E, "Forming the Contact Surface of Micromechanical Switches", IBM J. Res. Develop., vol. 23, No. 4, Jul. 1979, pp. 376-385.

(Continued)

*Primary Examiner*—Savitri Mulpuri

(57) ABSTRACT

The present invention relates to MEM switches. More specifically, the present invention relates to a system and method for making MEM switches having a common ground plane. One method for making MEM switches includes: patterning a common ground plane layer on a substrate; forming a dielectric layer on the common ground plane layer; depositing a DC electrode region through the dielectric layer to contact the common ground plane layer; and depositing a conducting layer on the DC electrode region so that regions of the conducting layer contact the DC electrode region, so that the common ground plane layer provides a common ground for the regions of the conducting layer.

7 Claims, 22 Drawing Sheets

OTHER PUBLICATIONS

Daniel Hyman, Juan Lam, Brett Warneke, Adele Schmitz, T. Y. Hsu, Julia Brown, James Schaffner, Andy Walston, Robert Y. Loo, Mehran Mehregany, and Jae Lee, "Surface-micromachined RF MEMS switches on GaAs substrates," International Journal of MicroElectroMechanical Systems (JMEMS), vol. 13, No. 6, Dec. 2004, pp. 902-911.

Y. Wang, Z. Li, D. T. McCormick, and N. C. Tien, "A Low-voltage Lateral MEMS Switch with High RF Performance," Journal of MicroElectroMechanical Systems (JMEMS), vol. 13, No. 6, Dec. 2004, pp. 902-911.

Yao, J.J., "RF MEMS from a device perspective", Journal Micromechanics and Microengineering 10: R9-R38, 2000.

Zavracky, P.M., Majumdar, S., McGruer,N, 1997, Micromechanical switches fabricated using nickel surface micromachining, Journal of Microelectromechannical Systems 6(1): 3-9.

* cited by examiner

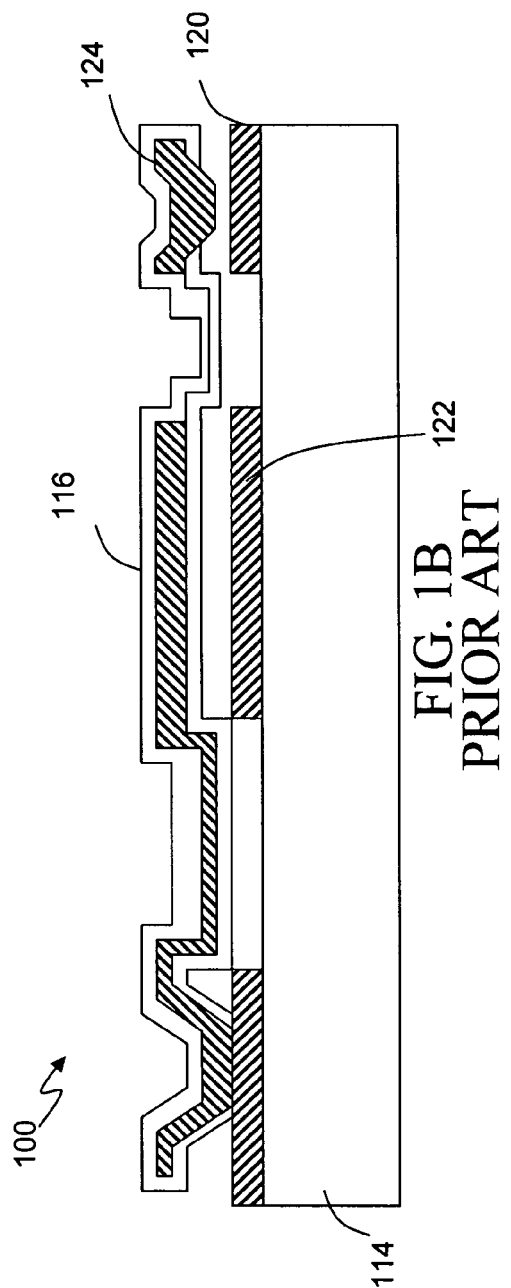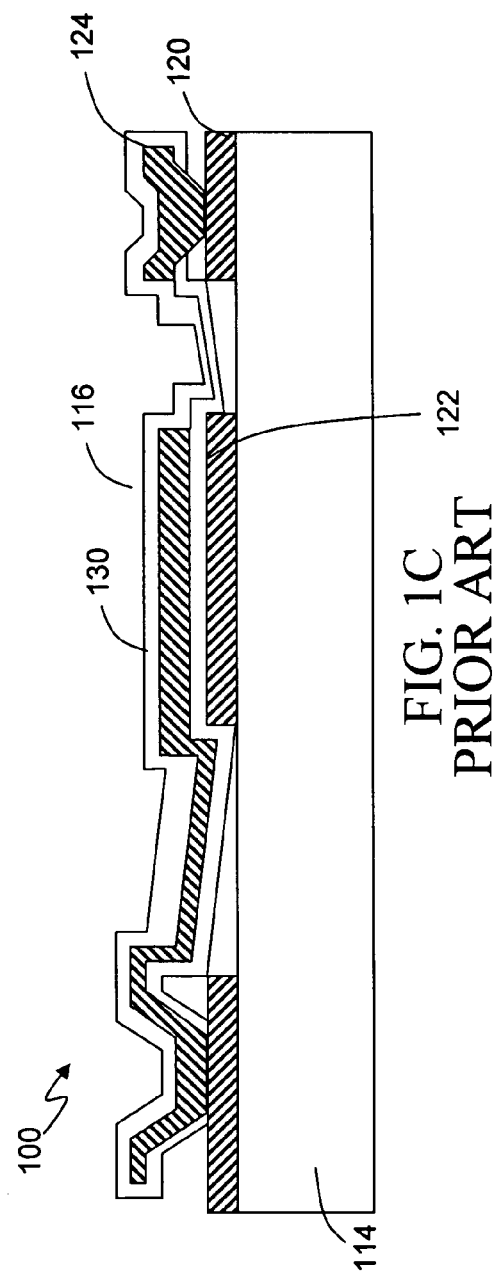

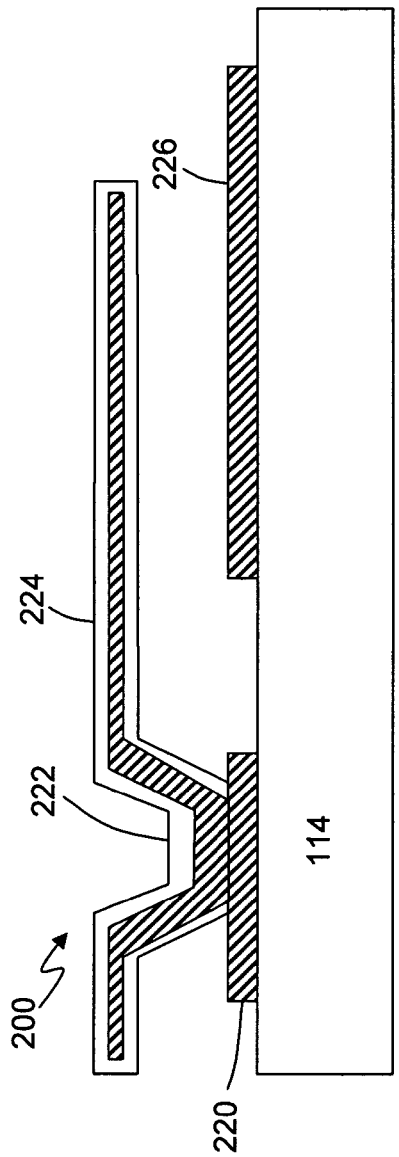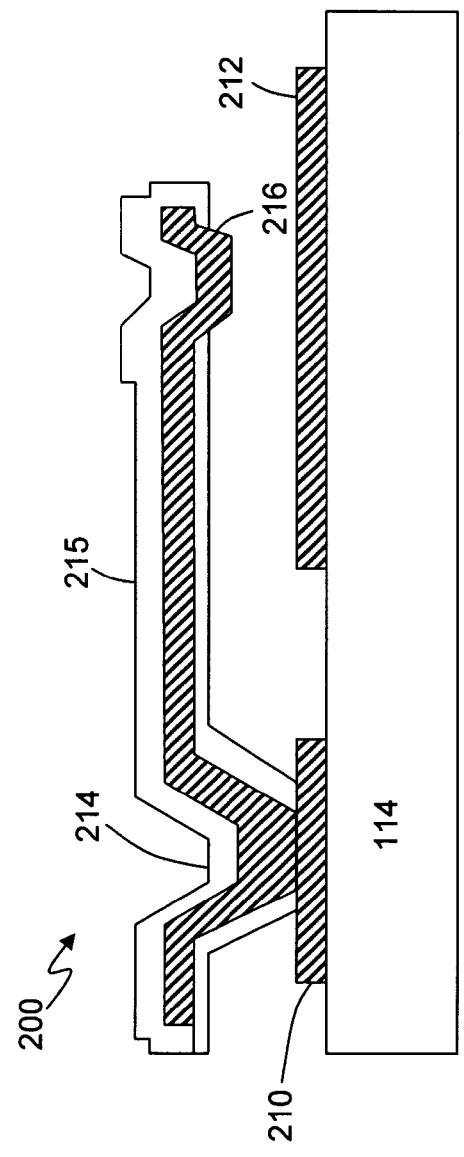
FIG. 2B PRIOR ART
FIG. 2C PRIOR ART

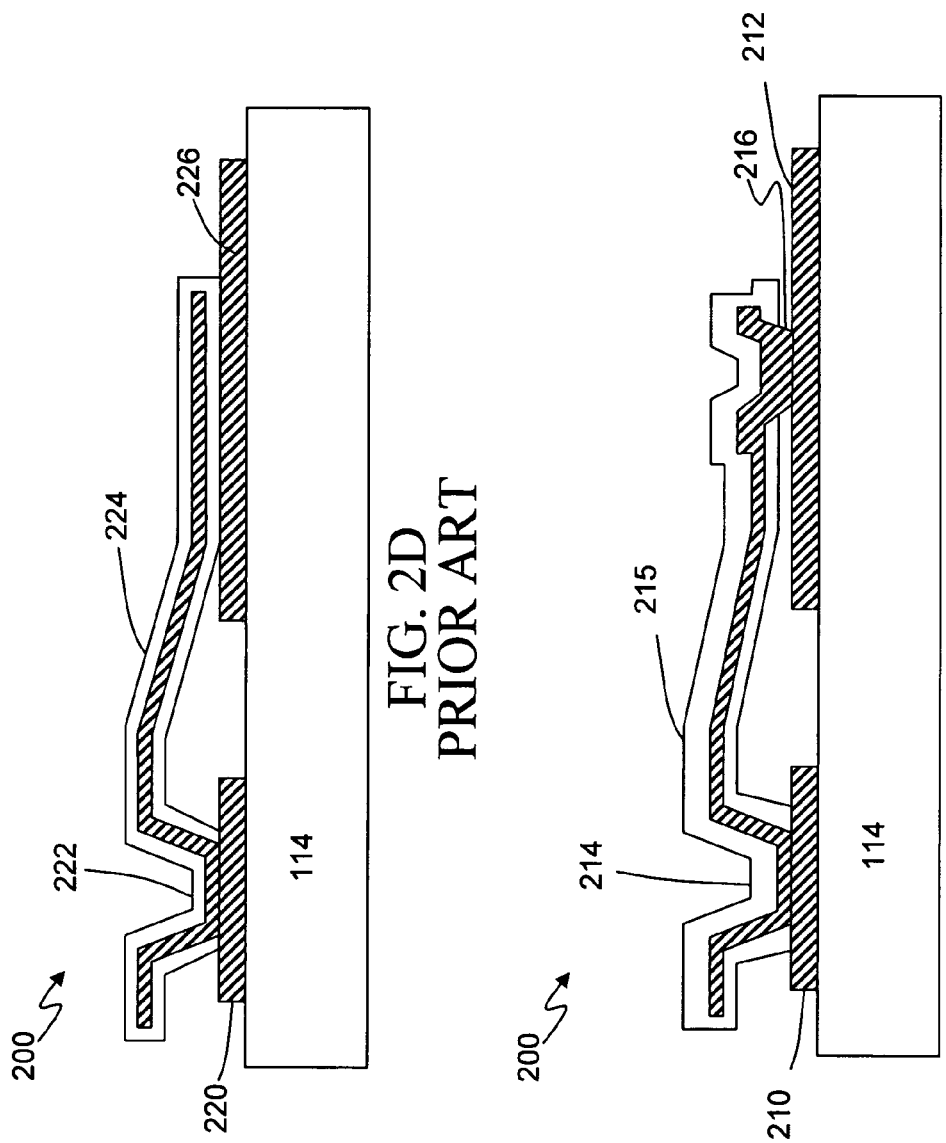

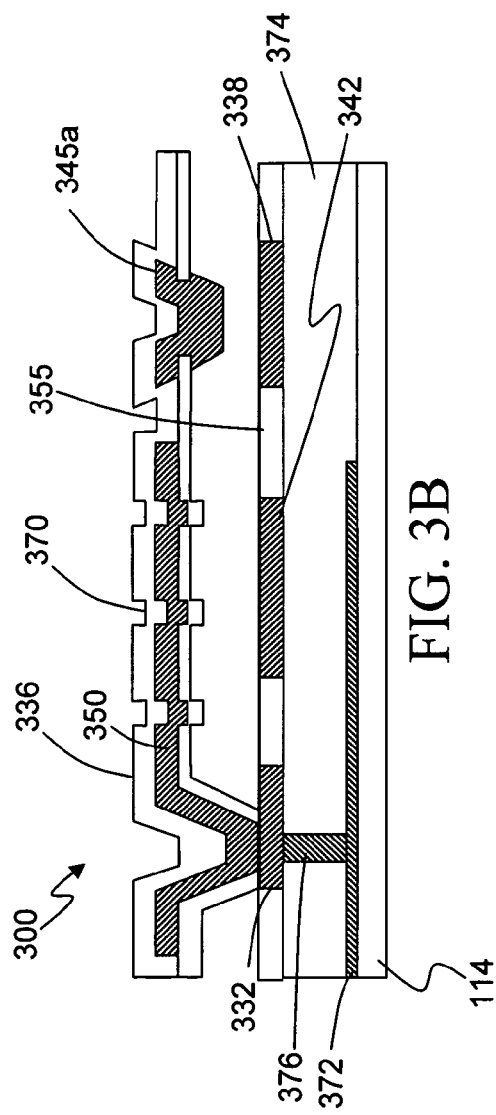
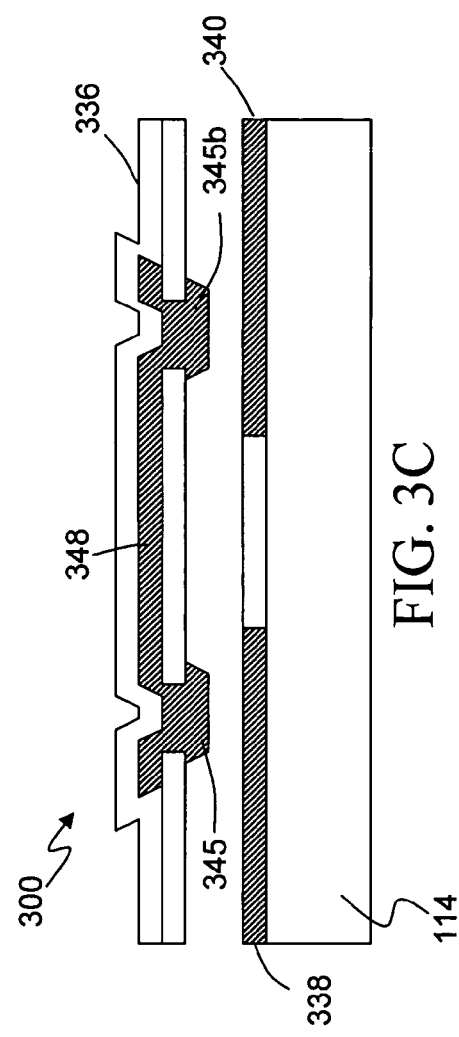
FIG. 3B
FIG. 3C

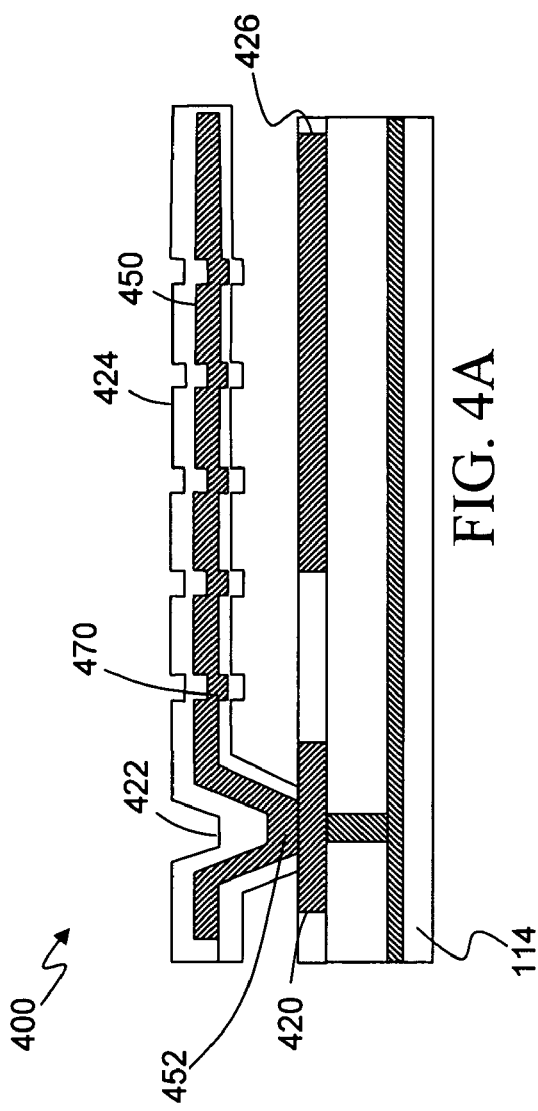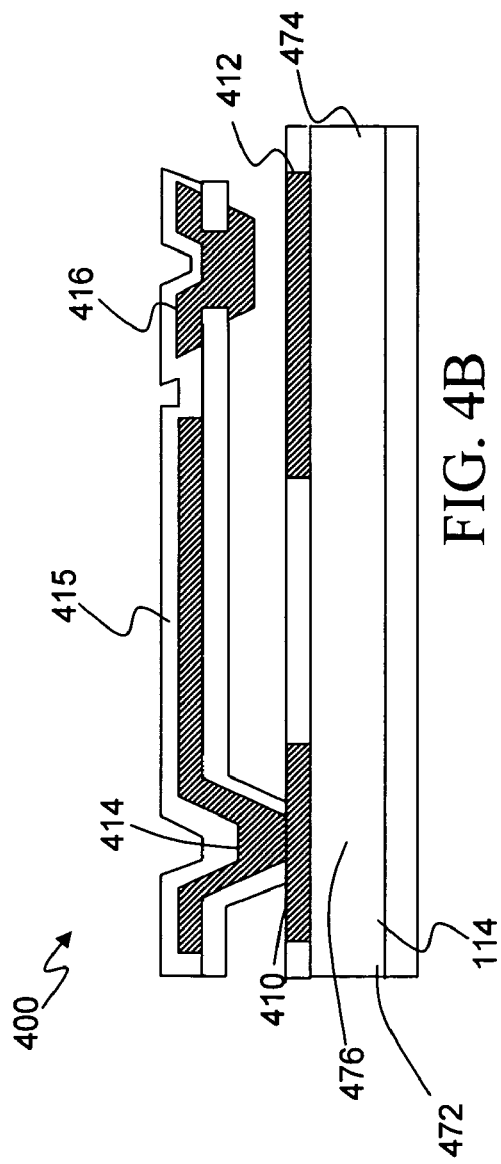

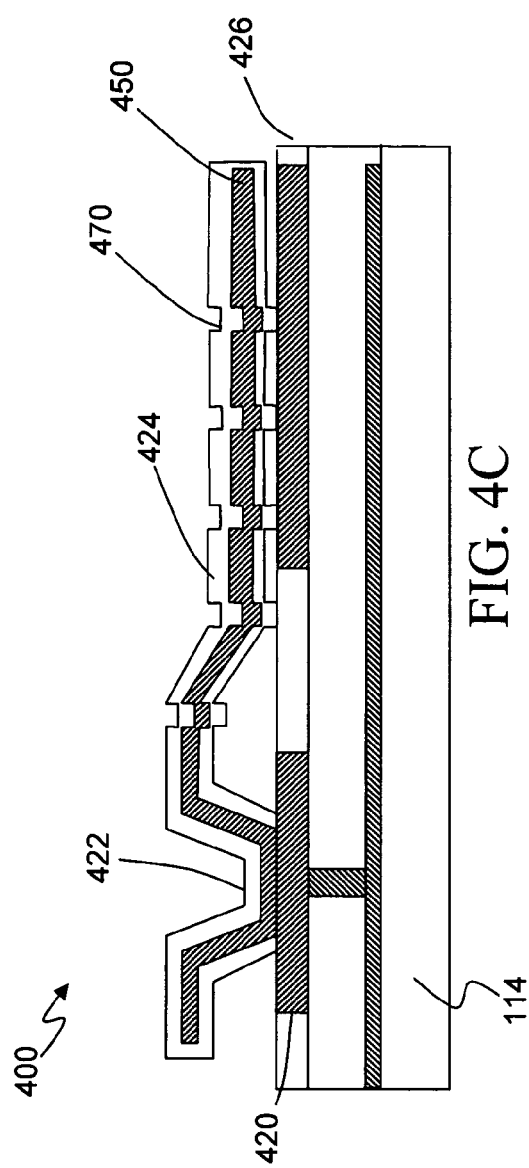
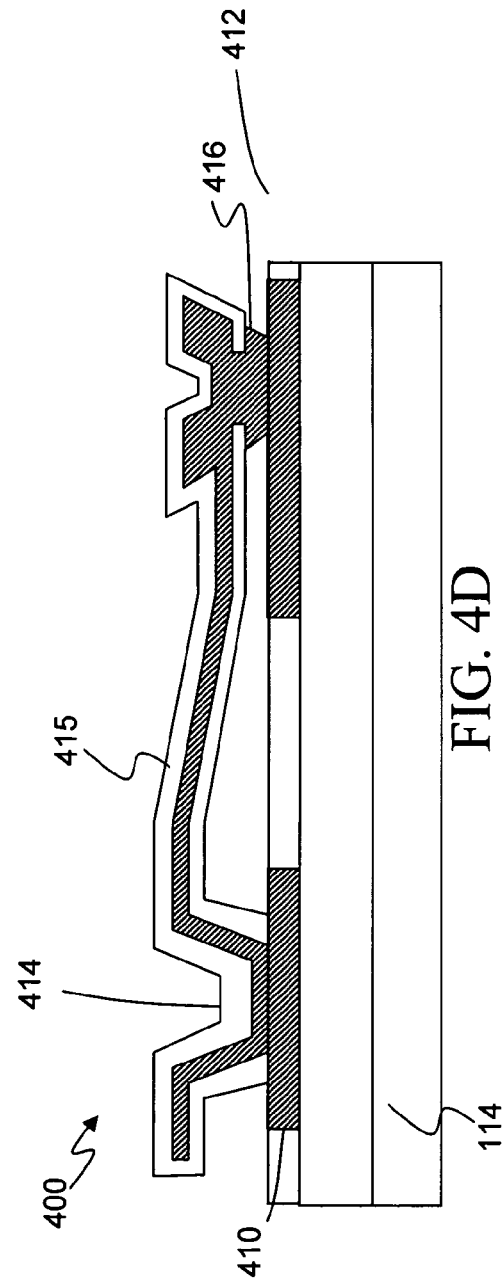
FIG. 4C
FIG. 4D

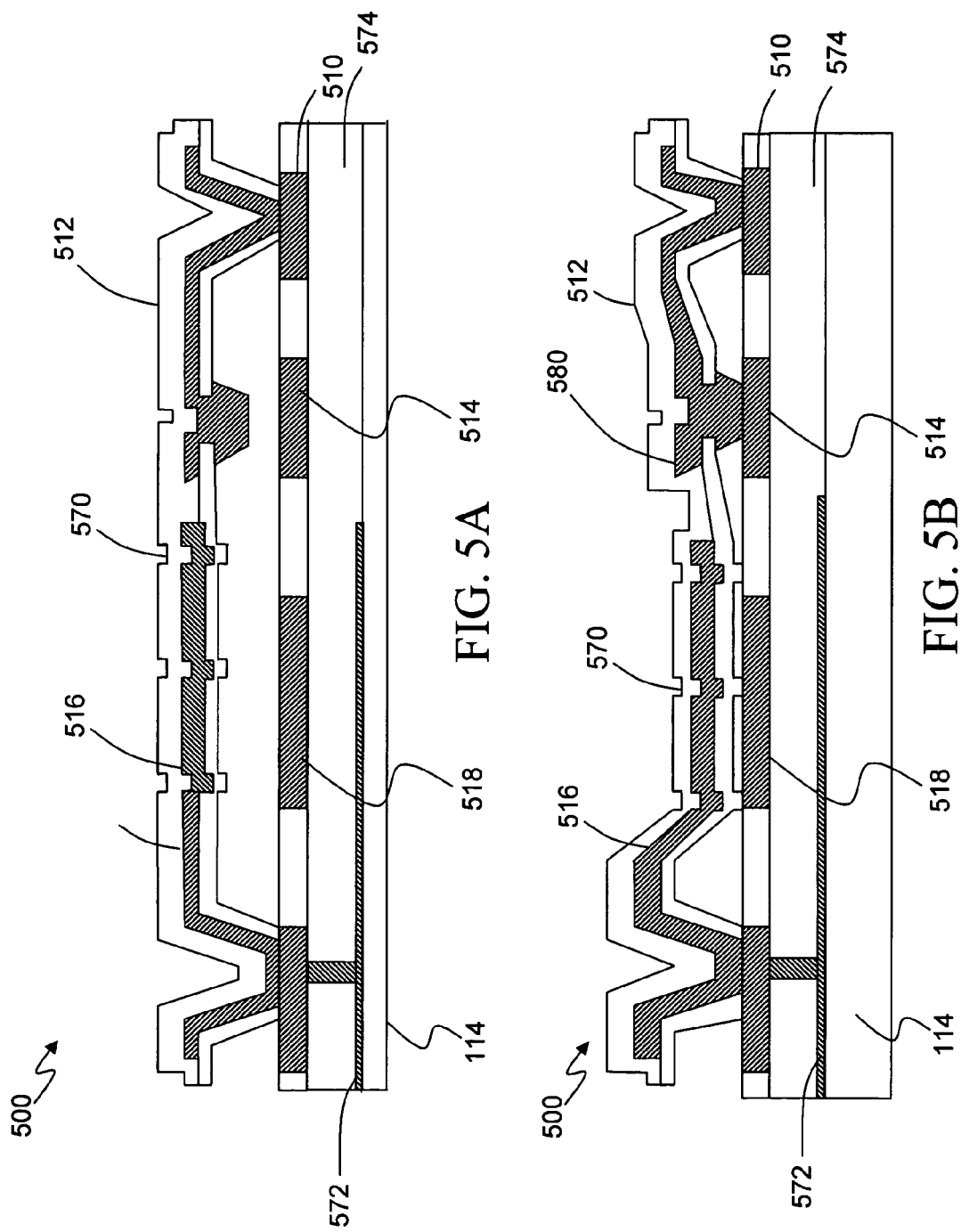

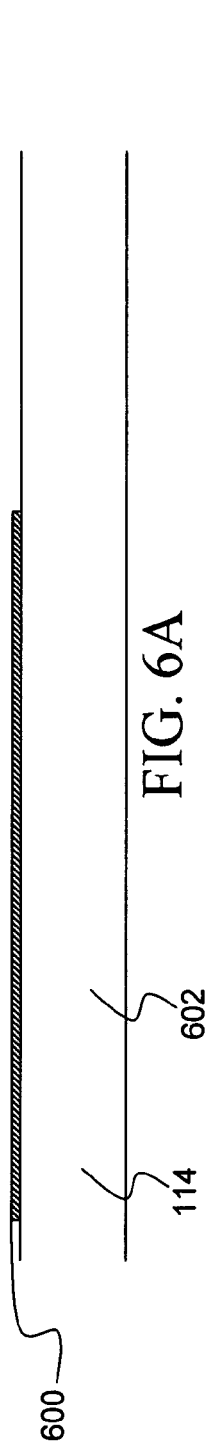
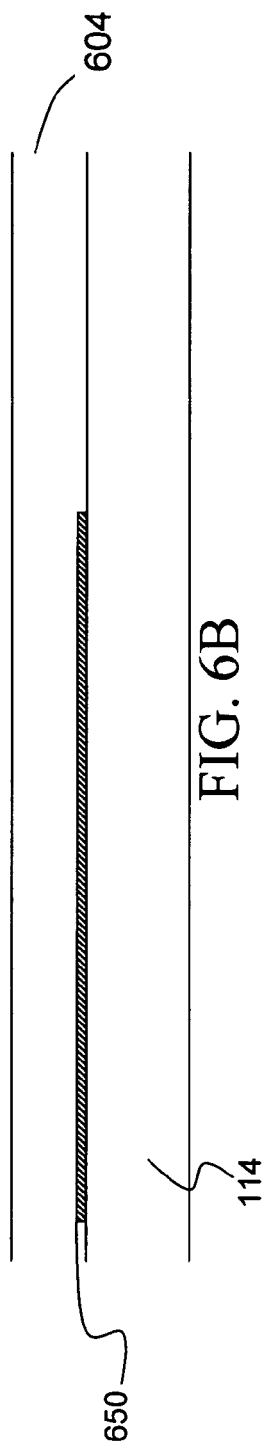
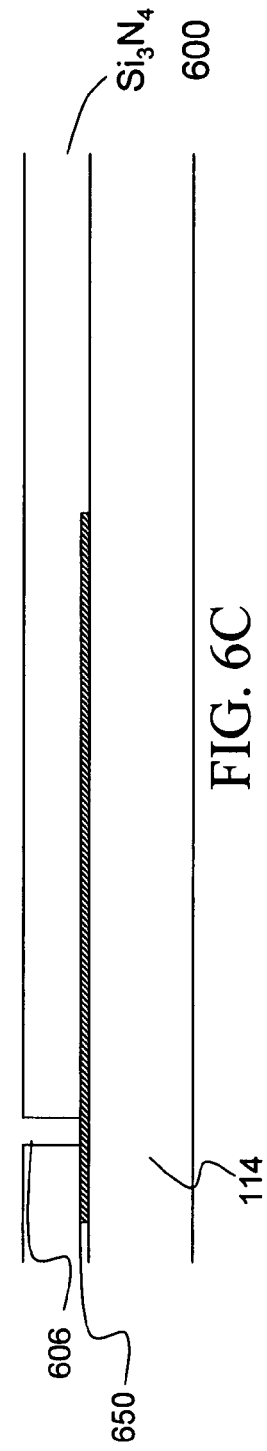
FIG. 6A
FIG. 6B
FIG. 6C

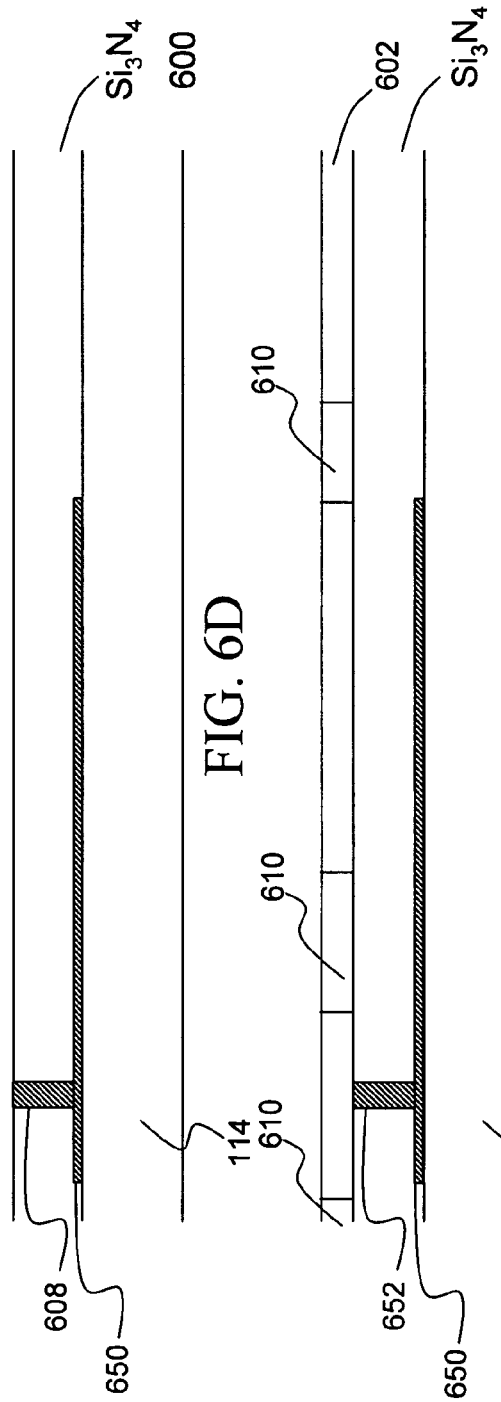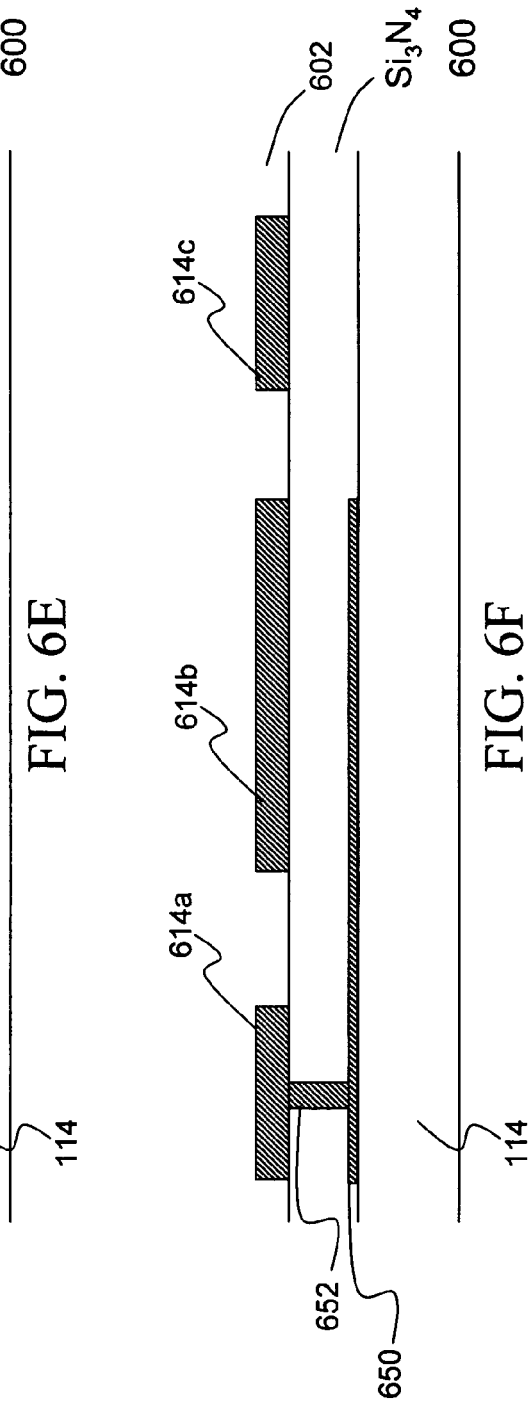

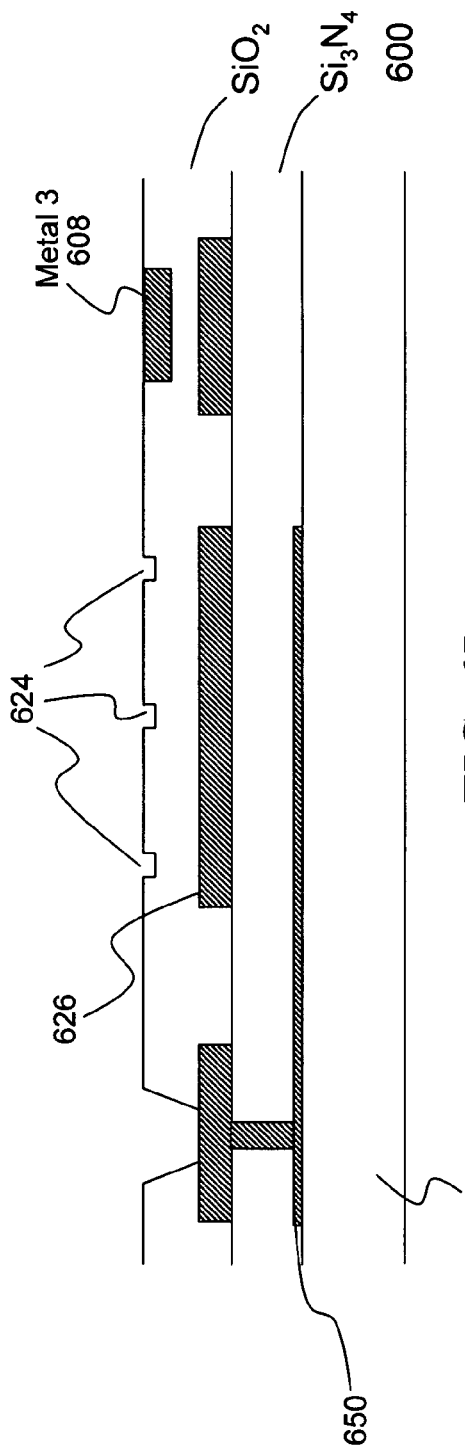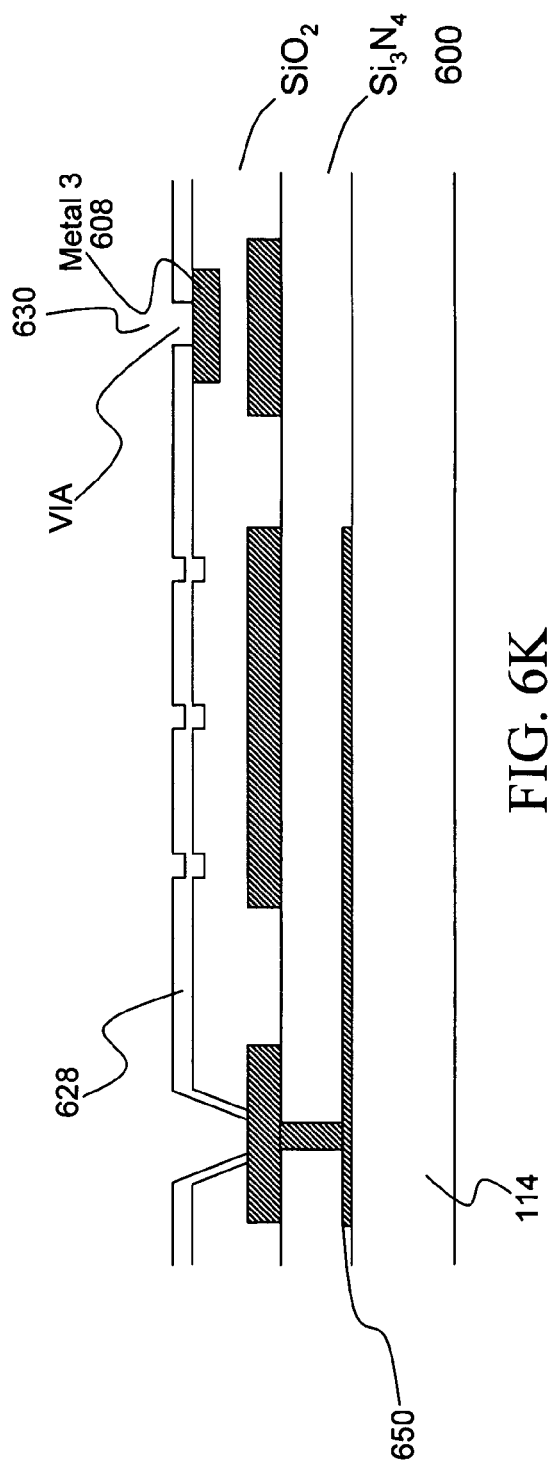

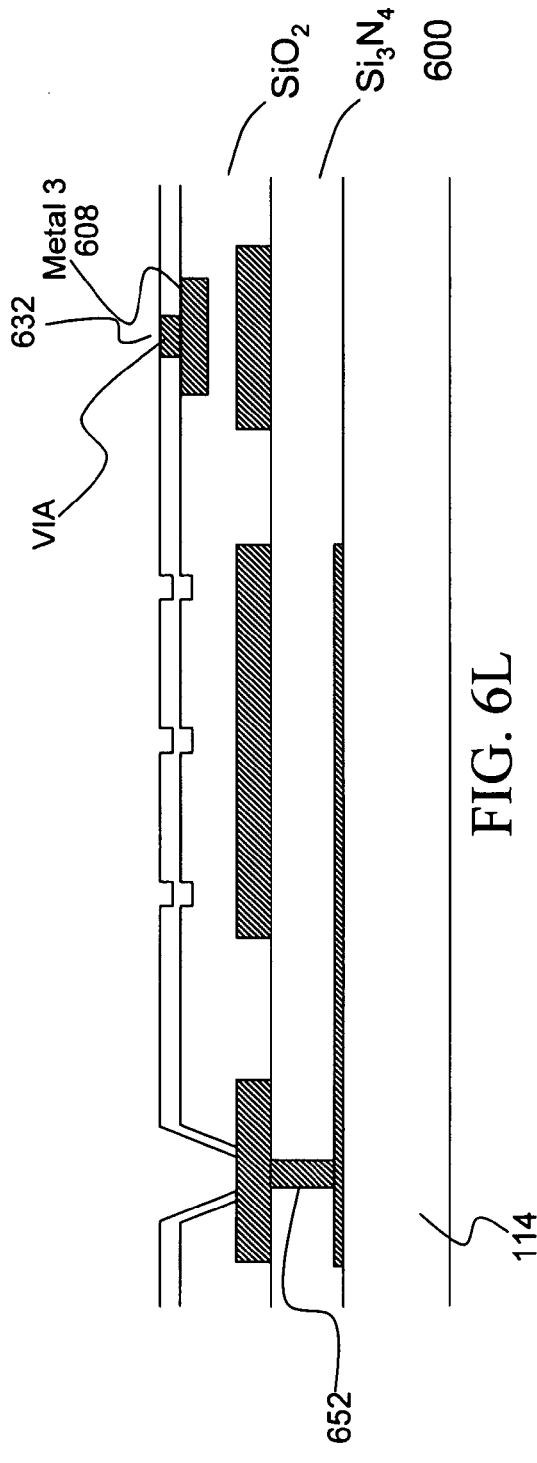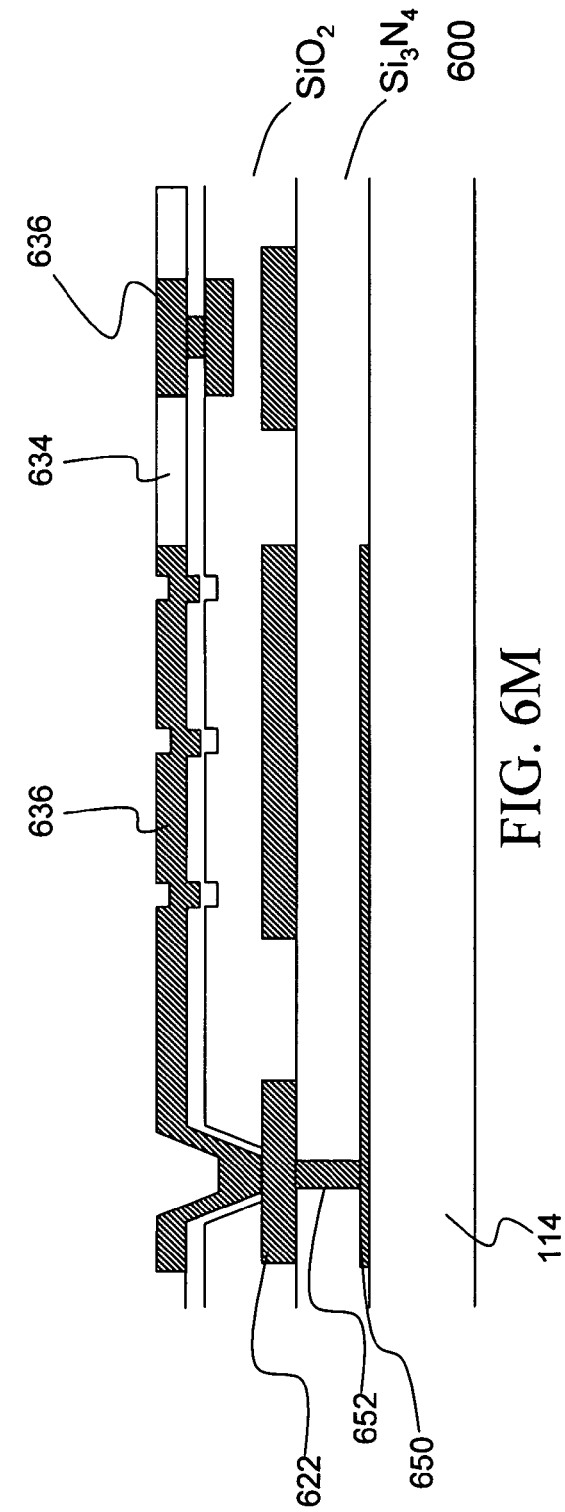

| Layer | Materials | Deposit Process | Removal Process | Etch Process | Thickness |
|---|---|---|---|---|---|
| Substrate | Semiconductors or Insulators, e.g., Silicon, GaAs, Quartz, Sapphire | N/A | N/A | N/A | 200 μm - 600 μm |
| Dielectric Layer | Nitride, Oxide, Phosphorous Doped Oxide | PECVD, LPCVD, Thermally grown oxide | N/A | Wet Etch/Dry Etch | .1 μm - 5 μm |
| Photoresist | Positive Photoresist/Negative Photoresist | Spin Coat | Resist Stripper/Plasma Stripping | Spray Develop/Tank Develop | 1 μm-8 μm |
| Substrate Electrodes | Gold/Any Conductor | Plating, E-beam Evaporation, Thermal Evaporation, Sputtering | N/A | Lift-off, Pattern and Etch | .5 μm-5 μm |
| Sacrificial Layer | Oxide, Silicon Metal (i.e., Al), Organic material | PECVD, LPCVD, E-Beam Evaporation Spin coat | Wet Etch/Dry Etch | N/A | .5 μm-5 μm |
| 1st Insulating Layer | Nitride/Oxide | PECVD | N/A | Dry Etch | .5 μm-5 μm |
| Top Electrode Layer(s) | Gold/Any Conductor | E-Beam Evaporation, Thermal Evaporation, Plating | N/A | Wet Etch, Lift-off | .5 μm-5 μm |
| 2nd Insulating Structure Layer | Nitride, Oxide | PECVD | N/A | Dry Etch, Ion Milling | .5 μm-5 μm |
| Ground Plane Layer | Any conductor, doped polysilicon (doped 10E16 to 10E20) | LPCVD, PECVD | N/A | Dry Etch, Wet Etch | .05 μm-5 μm |

FIG. 7

METHOD OF FABRICATING SEMICONDUCTOR DEVICES EMPLOYING AT LEAST ONE MODULATION DOPED QUANTUM WELL STRUCTURE AND ONE OR MORE ETCH STOP LAYERS FOR ACCURATE CONTACT FORMATION

RELATED APPLICATIONS

The present application is a continuation-in-part of U.S. Provisional patent application Ser. No. 10/783,772, filed Feb. 20, 2004, entitled "FABRICATION METHOD FOR MAKING A PLANAR CANTILEVER, LOW SURFACE LEAKAGE, REPRODUCIBLE AND RELIABLE METAL DIMPLE CONTACT MICRO-RELAY MEMS SWITCH."

BACKGROUND OF THE INVENTION (1) Technical Field

The present invention relates to a fabrication technique for a micro-electro-mechanical system (MEMS) micro relay switch to increase the reliability, yield, and performance of its contacts. Specifically, the invention relates to a technique for producing a microelectromechanical device having a common ground plane layer and a set of contact teeth.

(2) Discussion

Today, there are two types of MEMS switches for RF and microwave applications. One type is the capacitance membrane switch known as the shunt switch, and the other is the metal contact switch known as the series switch. Besides the two types of switches mentioned above, designs can vary depending on the methods with which the switches are actuated. Generally, switch designs are based on either electrostatic, thermal, piezoelectric, or magnetic actuation methods.

The metal contact series switch is a true mechanical switch in the sense that it toggles up (open) and down (close). One difference among the metal contact switch designs is in their armature structure. For example, switches from Sandia National Labs and Teravita Technologies use an all metal armature. MEMS switches from Rockwell use an armature composed of a metal layer on top of an insulator and switches from HRL Laboratories, LLC use an insulating armature having a metal electrode that is sandwiched between two insulating layers. Because of the difference in armature designs, metal contacts in these devices are all fabricated differently; however, in each of these designs the metal contacts are all integrated with part of the armature. The performance of these switches is mainly determined by the metal contact and the armature design. One important issue, occurring when the metal contact is part of the armature, relates to the fabrication process, wherein performance may be sacrificed if the contact is not well controlled.

U.S. Pat. No. 6,046,659 issued Apr. 4, 2000 to Loo et al. (herein after referred to as the "Loo Patent") discloses two types of micro-electro-mechanical system (MEMS) switches, an I-switch and a T-switch. In the "Loo Patent," both the I and T-MEMS switches utilize an armature design, where one end of an armature is affixed to an anchor electrode and the other end of the armature rests above a contact electrode.

FIG. 1A depicts a top view of a T-switch 100 as disclosed in the prior art. A cross-section of the switch shown in FIG. 1A is shown in FIGS. 1B and 1C. In FIG. 1B the switch is in an open position, while in FIG. 1C, the switch is in a closed position. In this aspect, a radio-frequency (RF) input transmission line 118 and a RF-output transmission line 120 are disposed on the substrate 114, shown in FIG. 1B. A conducting transmission line 128 is disposed across one end of an armature 116, allowing for connection between the RF-input transmission line 118 and the RF-output transmission line 120 when the switch is in the closed position. One skilled in the art will appreciate that the cross-section only shows the contact of the armature 116 with the RF-output transmission line 120, since the contact of the armature 116 with the RF-input transmission line 118 is directly behind the RF-output transmission line 120 when looking at the cross-section of the switch. Thus, for ease of explanation, FIGS. 1B and 1C will be discussed emphasizing the RF-output transmission line 120; however, the same explanation also holds for contacting of the RF-input transmission line 118. Further, one skilled in the art will appreciate that the RF-input and RF-output transmission lines are labeled as such for convenience purposes only and are interchangeable.

When the switch is in an open position, the transmission line 128 sits above (a small distance from) the RF-input transmission line 118 and the RF-output transmission line 120. Thus, the transmission line 128 is electrically isolated from both the RF-input transmission line 118 and the RF-output transmission line 120. Furthermore, because the RF-input transmission line 118 is not connected with the RF-output transmission line 120, the RF signals are blocked and they cannot conduct from the RF-input transmission line 118 to the RF-output transmission line 120.

When the switch is in closed position, the conducting transmission line 128 is in electrical contact with both the RF-output transmission line 120, and the RF-input transmission line 118. Consequently, the three transmission lines 120, 128, and 118 are connected in series to form a single transmission line in order to conduct RF signals. The "Loo Patent" also provides switches that have conducting dimples 124 and 124' attached with the transmission line 128 which define metal adhesion areas to improve contact characteristics.

FIG. 1B is a side view of a prior art micro-electro-mechanical system (MEMS) switch 100 of FIG. 1A in an open position. A conducting dimple 124 protrudes from the armature 116 toward the RF-output transmission line 120. The transmission line 128 (shown in FIG. 1A) is deposited on the armature 116 and electrically connects the dimple 124 associated with the RF-output transmission line 120 to another dimple 124' associated with the RF-input transmission line 118.

FIG. 1C depicts the MEMS switch 100 of FIG. 1A in a closed state. When a voltage is applied between a cantilever bias electrode 130 and a substrate bias electrode 122, an electrostatic attractive force will pull the cantilever bias electrode 130 as well as the attached armature 116 toward the substrate bias electrode 122, and the (metal) contact dimple 124 will touch the RF-output transmission line 120. The contact dimple 124 associated with the RF-input transmission line 118 will also come into contact with the RF-input transmission line 118, thus through the transmission line 128 (shown in FIG. 1A) the RF-input transmission line 118 is electrically connected with the RF-output transmission line 120 when the switch is in a closed position. Note that in the FIG. 1A, the armature 116 is anchored to the substrate 114 by an anchor 132 and that bias input signal pads 134 and 136 are provided for supplying voltage necessary for closing the switch 100.

FIG. 2A depicts a top view of an I-switch 200 as disclosed in the prior art. FIG. 2B depicts a direct current (DC) cross-section of the switch 200 while, FIG. 2C depicts a RF cross-section of the switch 200. In FIG. 2B, a DC signal is passed from the DC contact 220 through an anchor point 222 and into a DC cantilever structure 224. A substrate bias electrode 226 is positioned on the substrate 114. As a DC bias is applied to the DC contact 220 and the substrate bias electrode 226, the DC cantilever structure 224 is pulled toward the substrate 114, causing the RF cantilever structure 215 (shown in FIG. 2C), shown in FIG. 2A, to also be deflected toward the substrate 114. FIGS. 2D and 2E depict the switch 200 in the closed position from the same perspectives as shown in FIGS. 2B and 2C, respectively.

FIG. 2C depicts the RF cross-section of switch 200. The RF-input transmission line 210 passes through anchor point 214 and into the RF cantilever structure 215. The metal dimple 216 protrudes from the RF cantilever structure 215. For ease of explanation the RF cantilever structure 215 and the DC cantilever structure 224 are described herein as two separate structures; however, one skilled in the art will appreciate that these two structures are typically made of one piece of material. The metal dimple 216 provides an electrical contact between the RF-input transmission line 210 and the RF-output transmission line 212. As discussed above, when a DC bias is applied to the DC contact 210 and the substrate bias electrode 226 (shown in FIG. 2B), the RF cantilever structure 215 is deflected toward the substrate 114. The deflection of the RF cantilever structure 215 toward the substrate 114 provides an electrical path between the RF-input transmission line 210 and the RF-output transmission line 212. FIGS. 2D and 2E depict the switch 200 in the closed position from the same perspectives as shown in FIGS. 2B and 2C, respectively. Note that in FIG. 2A the path shown in FIGS. 2B and 2D is depicted between 200$b$ and 200$b'$ in and that the path shown in FIGS. 2C and 2E is depicted between 200$c$ and 200$c'$.

Both of the above-described switch types suffer from a bias-pad contact-related drawback in that when used for extensive periods, the region of the switch near the bias pad tends to "stick" in a closed position, effectively destroying the switch. Additionally, in arrays of switches, DC bias signals passed through a switch can cross-couple neighboring switches, thereby causing the actuation of the neighboring switches. The present invention overcomes these drawbacks by providing a set of "teeth" in the bias pad area to minimize adhesion and by providing a common ground plane to isolate individual switches in an array of switches, respectively.

SUMMARY

The present invention provides a system and a method that overcomes the aforementioned limitations and fills the aforementioned needs by providing a common ground plane for MEMS switches.

One aspect of the invention is a method for forming a common ground for an electromechanical device comprising acts of: patterning a common ground plane layer on a substrate; forming a dielectric layer on the common ground plane layer; depositing a DC electrode region through the dielectric layer to contact the common ground plane layer; and depositing a conducting layer on the DC electrode region so that regions of the conducting layer contact the DC electrode region, so that the common ground plane layer provides a common ground for the regions of the conducting layer.

Another aspect of the invention is a method for forming a common ground for an electromechanical device, wherein the act of patterning a common ground plane layer on a substrate further comprises acts of: depositing a ground plane photoresist pattern to form a common ground plane layer on at least a portion of a substrate having a substrate area; depositing the common ground plane layer into the ground plane photoresist pattern; and removing the ground plane photoresist pattern.

Yet another aspect of the invention is a method for forming a common ground for an electromechanical device, wherein the act of forming a dielectric layer on the common ground plane layer further comprises acts of: depositing a dielectric layer having a thickness and an area on the common ground plane layer; depositing a DC via photoresist pattern on the dielectric layer, patterned to leave a DC electrode via exposed; etching through the thickness of a portion of the area of the dielectric layer at the DC electrode via to form a DC via in the dielectric layer, where the DC via connects with the common ground plane layer; and removing the DC via photoresist pattern.

Yet another aspect of the present invention is a method for forming a common ground for an electromechanical device, wherein the act of depositing a conducting layer on the DC electrode region so that regions of the conducting layer contact the DC electrode region, so that the common ground plane layer provides a common ground for the regions of the conducting layer further comprises acts of: depositing a DC electrode region photoresist pattern; depositing a conducting layer on the DC electrode region photoresist pattern and dielectric layer to form a set of DC electrodes in the set of DC electrode regions, where a DC electrode is in contact with the common ground plane layer through the DC via; and removing the DC electrode region photoresist pattern.

Another aspect of the present invention is a method for forming a common ground for an electromechanical device, further comprising acts of: depositing a sacrificial layer over the conducting layer; depositing an anchor site photoresist pattern to provide for an anchor site; etching through the sacrificial layer to expose a portion of the conducting layer at a DC electrode region to form an anchor site; removing the anchor site photoresist pattern; depositing an insulating first structure layer on the sacrificial layer and the anchor site, the insulating first structure layer having an area; depositing a top electrode photoresist pattern for etching through the anchor site for providing contact to the conducting layer and for forming a top electrode; etching through the insulating first structure layer across at least a portion of the anchor site so that a portion of the conducting layer is exposed, and etching through the insulating first structure layer and through a portion of the thickness of the sacrificial layer at a top electrode site so that a top electrode space is defined through the insulating first structure layer, and into the sacrificial layer, proximate an electrode region; removing the top electrode photoresist pattern; depositing a device separation photoresist pattern on the insulating first structure layer, the device separation photoresist pattern forming separation regions for electrically separating desired areas of the electromechanical device and for separating desired devices; depositing a conducting second structure layer on the insulating first structure layer, the exposed portion of the conducting layer, and in the top electrode space, the conducting second structure layer having an area; removing the device separation photoresist pattern to eliminate unwanted portions of the conducting second structure layer in order to electrically separate desired areas of the electromechanical device and for separating desired devices; depositing an insulating third structure layer on the electromechanical device, across the substrate area, the insulating third structure layer having an area; depositing a device shape photoresist pattern on the electromechanical device, across the substrate area, with the device shape photoresist pattern defining desired device shapes by selective exposure; selectively etching through exposed portions of the insulating first structure layer and the insulating third structure layer to isolate an electromechanical device having a desired shape; and removing the device shape photoresist pattern.

Another aspect of the present invention is method for forming a common ground for an electromechanical, further comprising acts of: depositing a sacrificial layer on the dielectric layer and the conducting layer, the sacrificial layer having a thickness; and etching a plurality of tooth regions into the sacrificial layer proximate a portion of the conducting layer, such that the tooth regions, in a final device, provide a reduced adhesion area when the device closes.

Yet another aspect of the present invention is a method for forming a common ground for an electromechanical device, further comprising acts of: depositing an anchor site photoresist pattern to provide for an anchor site; etching through the sacrificial layer to an electrode region in order to expose a portion of the conducting layer at a DC electrode region to form an anchor site; removing the anchor site photoresist pattern; depositing an insulating first structure layer on the sacrificial layer and the anchor site, the insulating first structure layer having an area; depositing a top electrode photoresist pattern for etching through the anchor site for providing contact to the conducting layer and for forming a top electrode space; etching through the insulating first structure layer across at least a portion of the anchor site so that a portion of the conducting layer is exposed, and etching through the insulating first structure layer and through a portion of the thickness of the sacrificial layer at a top electrode site so that a top electrode space is defined through the insulating first structure layer, and into the sacrificial layer, proximate an electrode region; removing the top electrode photoresist pattern; depositing a device separation photoresist pattern on the insulating first structure layer, the device separation photoresist pattern forming separation regions for electrically separating desired areas of the electromechanical device and for separating desired devices; depositing a conducting second structure layer on the insulating first structure layer, the exposed portion of the conducting layer, and in the top electrode space, the conducting second structure layer having an area; removing the device separation photoresist pattern to eliminate unwanted portions of the conducting second structure layer in order to electrically separate desired areas of the electromechanical device and for separating desired devices; depositing an insulating third structure layer on the electromechanical device, across the substrate area, the insulating third structure layer having an area; depositing a device shape photoresist pattern on the electromechanical device, across the substrate area, with the device shape photoresist pattern defining desired device shapes by selective exposure; selectively etching through exposed portions of the insulating first structure layer and the insulating third structure layer to isolate an electromechanical device having a desired shape; and removing the device shape photoresist pattern.

Another aspect of the invention is a method for forming a common ground for an electromechanical device, wherein the act of forming a dielectric layer on the common ground plane layer further comprises acts of: depositing a dielectric layer having a thickness and an area on the common ground plane layer; depositing a DC via photoresist pattern on the dielectric layer, patterned to leave a DC electrode via exposed; etching through the thickness of a portion of the area of the dielectric layer at the DC electrode via to form a DC via in the dielectric layer, where the DC via connects with the common ground plane layer; and removing the DC via photoresist pattern.

Yet another aspect of the present invention is a method for forming a common ground for an electromechanical device, wherein the act of depositing a conducting layer on the DC electrode region so that regions of the conducting layer contact the DC electrode region, so that the common ground plane layer provides a common ground for the regions of the conducting layer further comprises acts of: forming a DC electrode in set of DC electrode regions, where a DC electrode is in contact with the common ground plane layer through the DC via.

Another aspect of the present invention is a method for forming a common ground for an electromechanical device, further comprising acts of: depositing a sacrificial layer, the sacrificial layer having a thickness; and etching a plurality of tooth regions into the sacrificial layer proximate a portion of the conducting layer, such that the tooth regions, in a final device, provide a reduced adhesion area when the device closes.

Yet another aspect of the present invention is a method for forming a common ground for an electromechanical device, further comprising acts of: depositing an anchor site photoresist pattern to provide for an anchor site; etching through the sacrificial layer to an electrode region in order to expose a portion of the conducting layer at a DC electrode region to form an anchor site; removing the anchor site photoresist pattern; depositing an insulating first structure layer on the sacrificial layer and the anchor site, the insulating first structure layer having an area; depositing a top electrode photoresist pattern for etching through the anchor site for providing contact to the conducting layer and for forming a top electrode space; etching through the insulating first structure layer across at least a portion of the anchor site so that a portion of the conducting layer is exposed, and etching through the insulating first structure layer and through a portion of the thickness of the sacrificial layer at a top electrode site so that a top electrode space is defined through the insulating first structure layer, and into the sacrificial layer, proximate an electrode region; removing the top electrode photoresist pattern; depositing a device separation photoresist pattern on the insulating first structure layer, the device separation photoresist pattern forming separation regions for electrically separating desired areas of the electromechanical device and for separating desired devices; depositing a conducting second structure layer on the insulating first structure layer, the exposed portion of the conducting layer, and in the top electrode space, the conducting second structure layer having an area; removing the device separation photoresist pattern to eliminate unwanted portions of the conducting second structure layer in order to electrically separate desired areas of the electromechanical device and for separating desired devices; depositing an insulating third structure layer on the electromechanical device, across the substrate area, the insulating third structure layer having an area; depositing a device shape photoresist pattern on the electromechanical device, across the substrate area, with the device shape photoresist pattern defining desired device shapes by selective exposure; selectively etching through exposed portions of the insulating first structure layer and the insulating third structure layer to isolate an electromechanical device having a desired shape; and removing the device shape photoresist pattern.

Yet another aspect of the invention is a method of forming tooth regions on a metal portion of an electromechanical device comprising acts of: etching a plurality of tooth regions in to a sacrificial layer proximate a portion of a conducting layer; and depositing an insulating first structure layer over the sacrificial layer such that portions of the insulating first structure layer conform with the tooth regions to form teeth; whereby the insulating first structure layer may be urged into contact with another portion of the electromechanical device with the teeth providing a reduced adhesion area.

Another aspect of the present invention is a method of forming tooth regions on a metal portion of an electromechanical device, further comprising acts of: patterning a conducting layer on a substrate such that portions of the conducting layer form electrodes; and depositing a sacrificial layer on portions of the substrate and the conducting layer, where the sacrificial layer deposited is the sacrificial layer into which tooth regions are etched.

Yet another aspect of the present invention is a method of forming tooth regions on a metal portion of an electromechanical device, further comprising acts of: depositing an anchor site photoresist pattern to provide for an anchor site; etching through the sacrificial layer to an electrode region in order to expose a portion of the conducting layer at a DC electrode region to form an anchor site; removing the anchor site photoresist pattern; depositing an insulating first structure layer on the sacrificial layer and the anchor site, the insulating first structure layer having an area; depositing a top electrode photoresist pattern for etching through the anchor site for providing contact to the conducting layer and for forming a top electrode space; etching through the insulating first structure layer across at least a portion of the anchor site so that a portion of the conducting layer is exposed, and etching through the insulating first structure layer and through a portion of the thickness of the sacrificial layer at a top electrode site so that a top electrode space is defined through the insulating first structure layer, and into the sacrificial layer, proximate an electrode region; removing the top electrode photoresist pattern; depositing a device separation photoresist pattern on the insulating first structure layer, the device separation photoresist pattern forming separation regions for electrically separating desired areas of the electromechanical device and for separating desired devices; depositing a conducting second structure layer on the insulating first structure layer, the exposed portion of the conducting layer, and in the top electrode space, the conducting second structure layer having an area; removing the device separation photoresist pattern to eliminate unwanted portions of the conducting second structure layer in order to electrically separate desired areas of the electromechanical device and for separating desired devices; depositing an insulating third structure layer on the electromechanical device, across the substrate area, the insulating third structure layer having an area; depositing a device shape photoresist pattern on the electromechanical device, across the substrate area, with the device shape photoresist pattern defining desired device shapes by selective exposure; selectively etching through exposed portions of the insulating first structure layer and the insulating third structure layer to isolate an electromechanical device having a desired shape; and removing the device shape photoresist pattern.

Yet another aspect of the invention is a common ground for an electromechanical device comprising: a substrate layer; a common ground plane layer formed on a portion of the substrate layer; a dielectric layer formed on the common ground plane layer and the substrate layer, the dielectric layer formed with conductor spaces therein, where at least one of the conductor spaces is in contact with the ground metal layer, the dielectric layer further including a dielectric top surface; and a conducting layer formed as a set of conductors in the conductor spaces of the dielectric layer, with at least one of the conductors in contact with the common ground plane layer, the conducting layer having a conducting layer top surface, and where the dielectric top surface and the conducting layer top surface are formed in a substantially co-planar fashion to provide a planarized substrate structure.

Another aspect of the invention is a set of tooth regions formed on a metal portion of an electromechanical device comprising: a plurality of tooth regions formed from a portion of a conducting layer, whereby the conducting layer may be urged into contact with another portion of the electromechanical device with the tooth regions providing a reduced adhesion area.

BRIEF DESCRIPTION OF THE DRAWINGS

The objects, features and advantages of the present invention will be apparent from the following detailed descriptions of the preferred aspect of the invention in conjunction with reference to the following drawings, where:

FIG. 1B is a side-view of the prior art T-MEMS switch presented in FIG. 1A, in an open position;

FIG. 1C is a side-view of the prior art T-MEMS switch presented in FIG. 1A, in a closed position;

FIG. 2B is a side-view of the DC cross-section of the prior art I-MEMS switch presented in FIG. 2A, in an open position;

FIG. 2C is a side-view of the RF cross-section of the prior art I-MEMS switch presented in FIG. 2A, in an open position;

FIG. 2D is a side-view of the DC cross-section of the prior art I-MEMS switch presented in FIG. 2A, in a closed position;

FIG. 2E is a side-view of the RF cross-section of the prior art I-MEMS switch presented in FIG. 2A, in a closed position;

FIG. 3B is a side-view of the T-MEMS switch presented in FIG. 3A, in an open position;

FIG. 3C is a cross-section of the T-MEMS presented in FIG. 3A, in the open position, where the cross section is taken along a line through electrodes 340 and 338;

FIG. 4A is a side view of a DC cross-section of an I-MEMS switch in an open position in accordance with the present invention;

FIG. 4B is a side view of a RF cross-section of the I-MEMS switch presented in FIG. 4A, in an open position;

FIG. 4C is a side view of the DC cross-section of the I-MEMS switch presented in FIG. 4A, in a closed position;

FIG. 4D is a side view of the RF cross-section of the I-MEMS switch presented in FIG. 4A, in a closed position;

FIG. 5A depicts a side view of a cross-section of a doubly supported cantilever beam MEMS switch in an open position in accordance with the present invention;

FIG. 5B depicts a side view of a cross-section of a doubly supported cantilever beam MEMS switch presented in FIG. 5A, in a closed position;

FIG. 7 is a table presenting various non-limiting examples of materials, deposition processes (where applicable), removal processes (where applicable), etch processes (where applicable), and thickness ranges for the various layers that make up a MEMS switch according to the present invention;

DETAILED DESCRIPTION

Figure 1A:
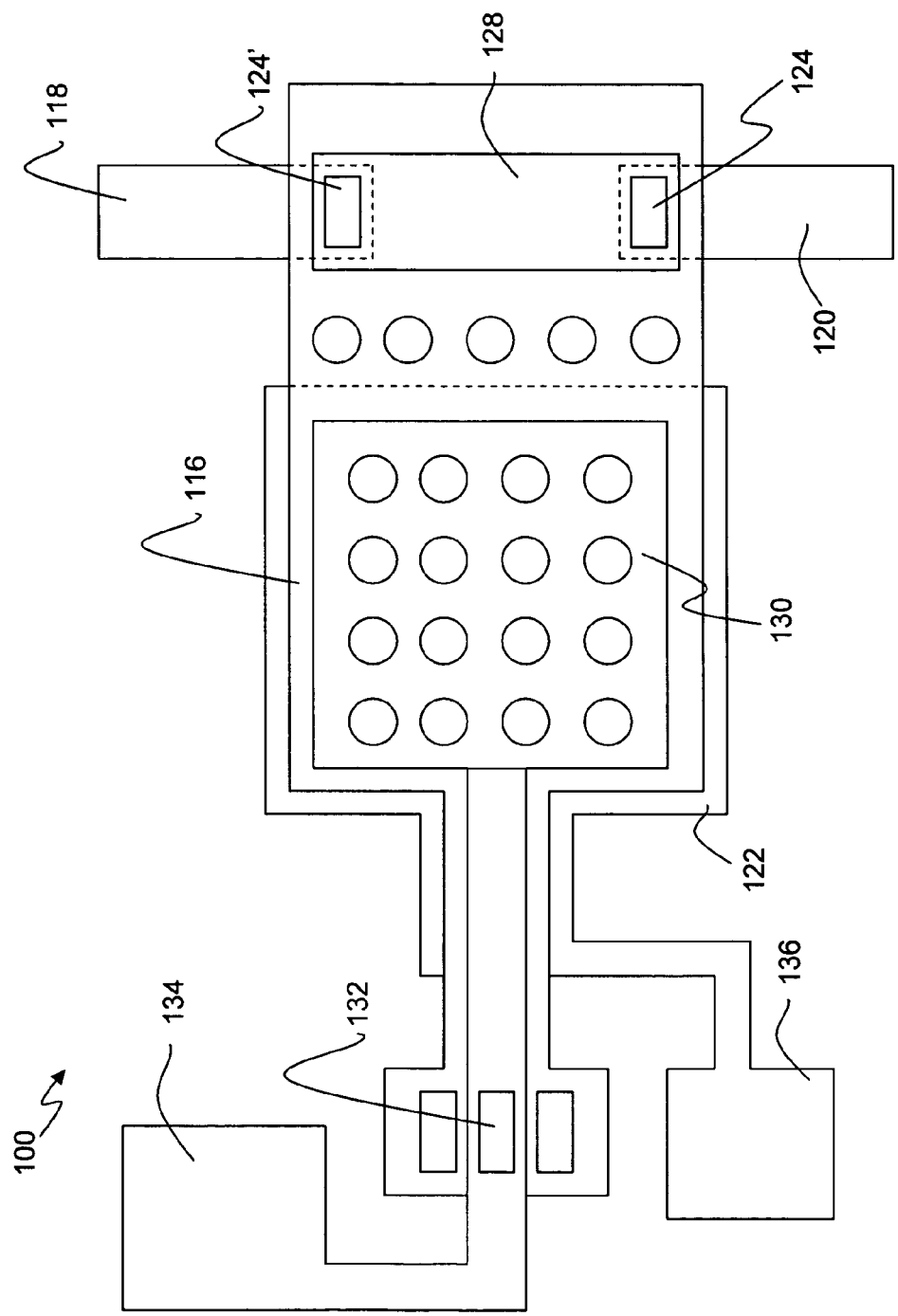
FIG. 1A is a top view of a prior art T-MEMS switch.
Figure 2A:
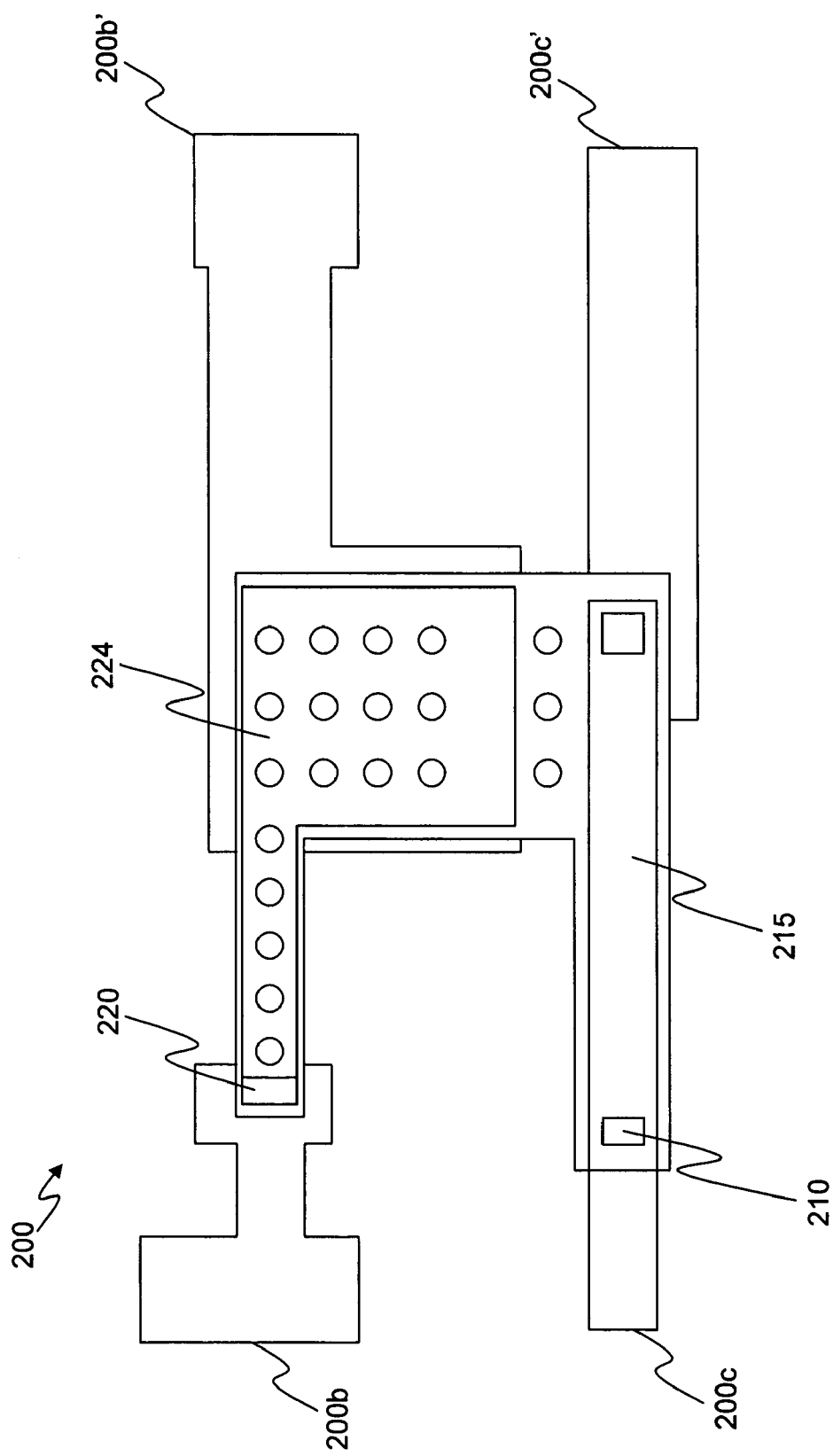
FIG. 2A is a top view of a prior art I-MEMS switch.

The present invention relates to fabrication techniques for increasing the reliability and performance of contacts in micro-electro-mechanical system (MEMS) switches. Specifically, the invention relates to the fabrication of a planar cantilever beam, lower surface leakage, a more reliable metal contact dimple design and a high yield process. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of aspects. Thus, the present invention is not intended to be limited to the aspects presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

In order to provide a working frame of reference, first a glossary of terms used in the description and claims is provided. Next, a discussion of various principal aspects of the present invention is provided. Third, an introduction is presented to provide the reader with a general understanding of the present invention. Fourth, a discussion is provided to give an understanding of the specific details of the present invention. Fifth, experimental results are provided for the reader to have a better understanding of the invention in actual use. Finally, a conclusion is provided to summarize key aspects of the present invention.

(1) Glossary

Before describing the specific details of the present invention, a centralized location is provided in which various terms used herein and in the claims are defined. The glossary provided is intended to provide the reader with a general understanding for the intended meaning of the terms, but is not intended to convey the entire scope of each term. Rather, the glossary is intended to supplement the rest of the specification in more accurately explaining the terms used.

Actuation portion: A part of a switch that moves to connect or disconnect an electrical path. Some examples include an armature and a cantilever.

Cantilever: A beam that sits above the substrate. It is affixed at the metal contact electrode at one end, and suspended freely above the RF electrodes at the opposite end.

Common ground: A conductive layer positioned proximate a group of contacts to provide a common ground reference to eliminate stray (undesired) signals from affecting neighboring (other) devices.

Metal dimple portion: An area of metal that protrudes from an armature providing increased contact reliability in MEMS switches. Also referred to as a metal dimple contact.

Tooth: A surface feature created proximate a adhesion area of the switch that minimizes the adhesion in order to ensure proper release of the switch after closure.

(2) Principal Aspects

The present invention has three principal aspects. The first is a MEMS switch with a set of teeth formed proximate an armature bias pad to minimize surface area adhesion and a common ground layer to provide a common (reference) ground for a plurality of devices. The MEMS switch includes an actuating portion which moves from a first position to a second position, where in the second position the switch provides a path for an RF signal. A metal dimple is desirably placed on a portion of the cantilever beam that contacts metal on the RF electrodes on the substrate when the MEMS switch is closed. The present invention also teaches a fabrication method (and products by the method) that provides a set of contact teeth along with a common ground layer in order to manufacture MEMS switches having high yield and improved performance reliability. Additionally, the various acts in a method according to the present invention may be automated and computer-controlled, the present invention also teaches a computer program product in the form of a computer readable media containing computer-readable instructions for operating machinery to perform the various acts required to make a MEMS switch according to the present invention. These instructions may be stored on any desired computer readable media, non-limiting examples of which include optical media such as compact discs (CDs) and digital versatile discs (DVDs), magnetic media such as floppy disks and hard drives, and circuit-based media such as flash memories and field-programmable gate arrays (FPGAs). The computer program product aspect will be discussed toward the end of this description.

Figure 3A:
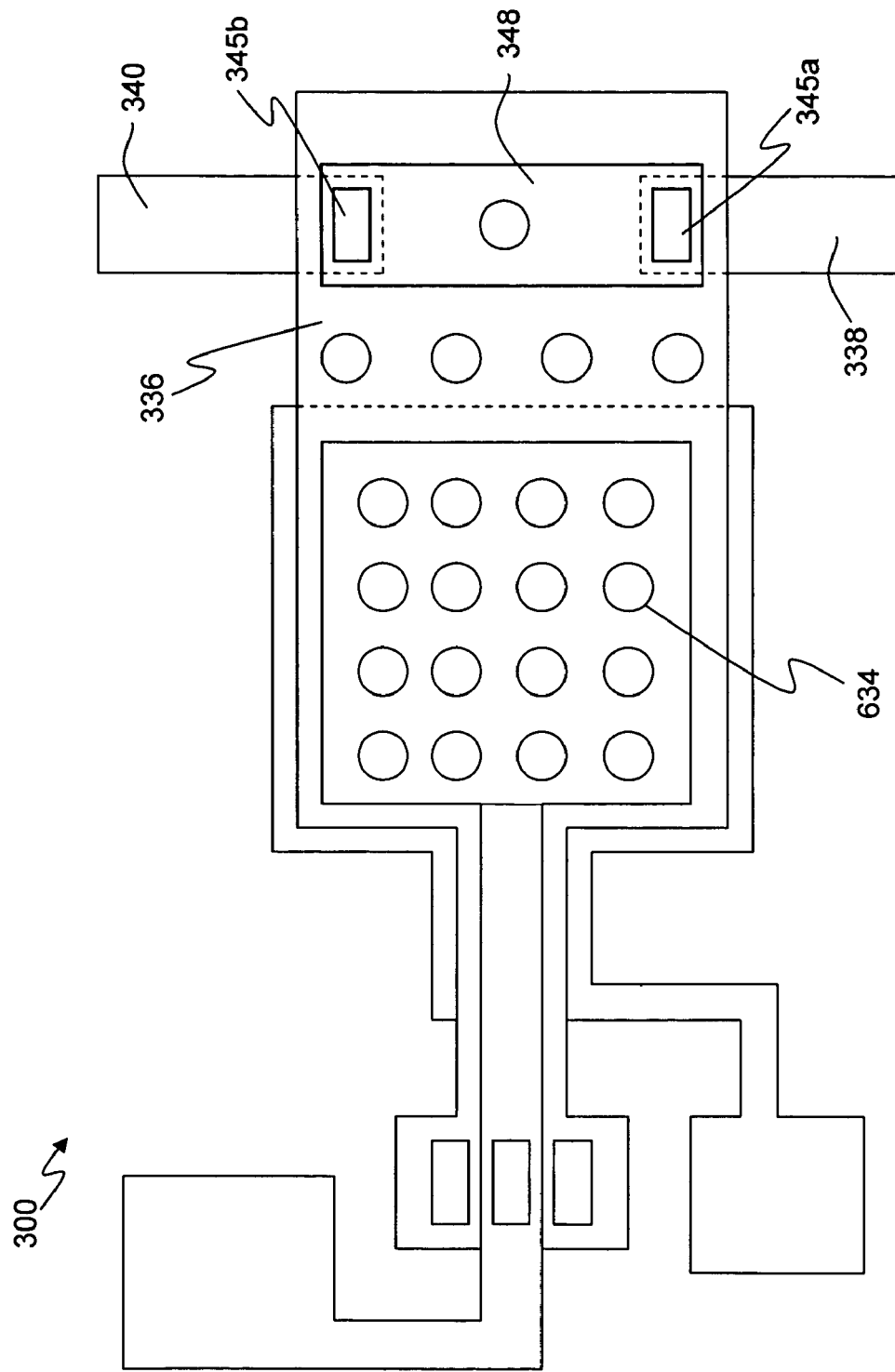
FIG. 3A is a top view of a T-MEMS switch in accordance with the present invention.

FIG. 3A is a top view of a T-MEMS switch 300. An armature 336 allows for an electrical connection between a first RF transmission line, i.e. an RF-input transmission line 340 and a second RF transmission line, i.e. an RF-output transmission line 338, when the switch is in a closed position.

FIG. 3B shows one side-view cross-section of the T-MEMS switch 300. One skilled in the art will appreciate that the cross-section only shows the contact of the armature 336 with the RF-output transmission line 338, since the contact of the RF-input transmission line 340 (shown in FIG. 3A) is directly behind the RF-output transmission line 338 when looking at the cross-section of the switch. One end of the armature 336 is affixed to an anchor electrode 332 on a substrate 114. The other end of the armature 336 is positioned over the RF-line which is divided into two separate sections, the RF-input transmission line 340 and the RF-output transmission line 338. The RF-input transmission line 340 and the RF-output transmission line 338 are separated by a gap (visible in FIG. 3A). A substrate bias electrode 342 is attached with the substrate 114 below the armature 336. The armature 336 sits above the substrate bias electrode 342 and is electrically isolated from the substrate bias electrode 342 by an air gap forming a parallel plate capacitor when the MEMS switch 300 is in an "open" position. An output top dimple electrode 345a is placed on one end of the armature 336 above the output RF transmission line 338. Similarly, an input top dimple electrode 345b (visible in FIG. 3A) is placed on the end of the armature 336 above the input RF transmission line 340, shown in FIG. 3C. The output top dimple electrode 345a and the input top dimple electrode 345b are electrically connected via a transmission line 348, shown in FIG. 3A. In one aspect, the transmission line 348 is a metal film transmission line embedded inside the armature 336.

In order to minimize the adhesion between the portion of the armature proximate a cantilever bias electrode 350 and the substrate bias electrode 342 when the switch 300 is closed, a set of teeth 370 is provided, formed in the first structure layer of the armature. Furthermore, a common ground layer 372 formed under a dielectric layer 374 provides a common ground contact through vias 376 to the anchor electrode 332 through a dielectric layer 374.

Figure 3D:
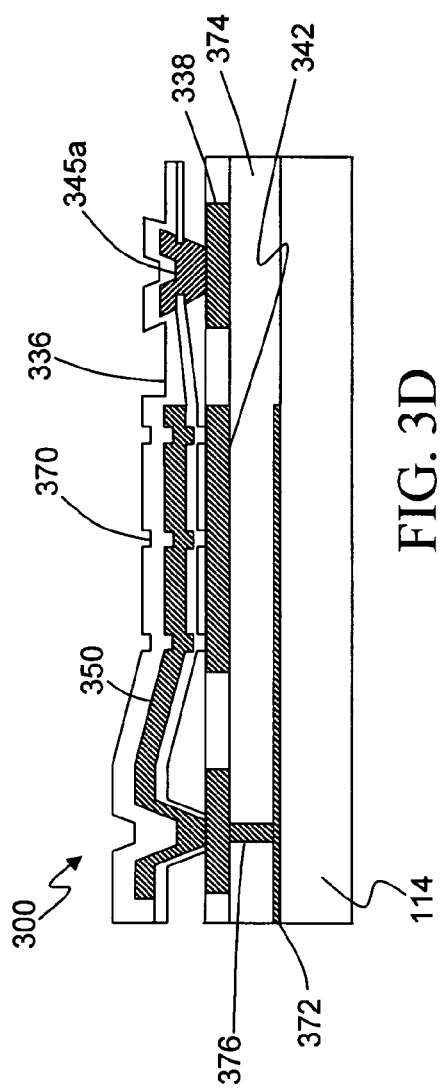
FIG. 3D is a side-view of the T-MEMS presented in FIG. 3A, in a closed position.

FIG. 3D depicts the cross-section of the T-MEMS switch 300 in FIG. 3B in a closed state. When a voltage is applied between the cantilever bias electrode 350 and the substrate bias electrode 342, an electrostatic attractive force will pull the cantilever bias electrode 350 as well as the attached armature 336 towards the substrate bias electrode 342. Consequently, the output top dimple electrode 345a touches the output RF transmission line 338 and the input top electrode 345b (visible in FIG. 3A) touches the input RF transmission line 340 (shown in FIG. 3E) providing a good electrical contact. Thus, the output top dimple electrode 345a, the transmission line 348 (visible in FIG. 3A), the input top dimple electrode 345b (visible in FIG. 3A) provide an electrical path for bridging the gap between the RF-input transmission line 340 and the RF-output transmission line 338, thereby closing the MEMS switch 300.

The substrate 114 may be comprised of a variety of materials. If the MEMS switch 300 is intended to be integrated with other semiconductor devices (i.e., with low-noise high electron mobility transistor (HEMT) monolithic microwave integrated circuit (MMIC) components), it is desirable to use a semi-insulating semiconducting substance such as gallium arsenide (GaAs), indium phosphide (InP) or silicon germanium (SiGe) for the substrate 114. This allows the circuit elements as well as the MEMS switch 300 to be fabricated on the same substrate using standard integrated circuit fabrication technology such as metal and dielectric deposition, and etching by using the photolithographic masking process. Other possible substrate materials include silicon, various ceramics, and quartz. The flexibility in the fabrication of the MEMS switch 300 allows the switch 300 to be used in a variety of circuits. This reduces the cost and complexity of circuits designed using the present MEMS switch.

Figure 3E:
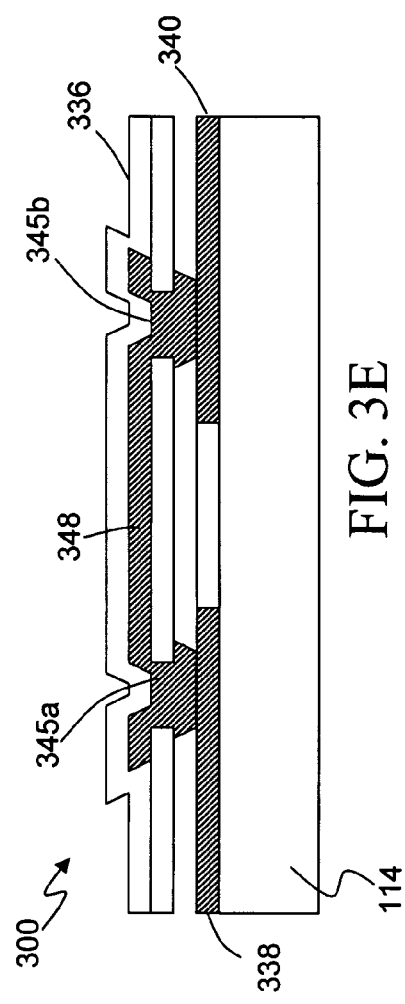
FIG. 3E is a cross-section of the T-MEMS switch presented in FIG. 3A, in the closed position, where the cross section is taken along a line through electrodes 340 and 338.

In the T-MEMS switch (see FIGS. 3A–3E), when actuated by electrostatic attraction, the armature 336 bends towards the substrate 114. This results in the output top dimple electrode 345a and the input top dimple electrode 345b on the armature 336 contacting the output RF transmission line 338 and input RF transmission line 340 respectively, and the armature 336 bending to allow the cantilever bias electrode 350 to physically contact the substrate bias electrode 342. This fully closed state is shown in FIG. 3E. The force of the metallic contact between the output RF transmission line 338 and the output top dimple electrode 345a (also the input RF transmission line 340 and the input top dimple electrode 345b) is thus dependent on the spring constant force at the RF-output transmission line 340 and RF-input transmission line 338 when the switch is closed. Metallic switches that do not have protruded dimple contact designs have contacts that depend upon the whole armature flexibility and bias strength. It is considered that this type of metal contact T-switch is less reliable than the micro-relay switches with protruded dimple contacts such as those taught here. In addition to improving the switch reliability, the quality of the contact itself is improved by the dimple because the dimple has controllable geometric features such as size (area and height) and shape. Thus, MEMS switches without the dimples 345a and 345b are more likely to have time-varying contact characteristics, a feature that may make them difficult or impossible to use in some circuit implementations.

One skilled in the art will appreciate that the RF-input transmission line 340 may be permanently attached with one end of the transmission line 348 in the armature 336. In this case, the switch 300 is open when a gap exists between the RF-output transmission line 338 and the transmission line 348. Further, one skilled in the art will appreciate that the RF-output transmission line 338 may be permanently attached with one end of the transmission line 348 in the armature 336. In this case the switch is open when a gap exists between the RF-input transmission line 340 and the transmission line 348.

Finally, although the top dimple electrodes 345a and 345b are shown in a desirable manner that provides a locking mechanism, sandwiching a layer of the armature therein, it should be appreciated by one of skill in the art that the particular top dimple electrode configuration used is not critical, and therefore any known or future configuration may be used.

FIG. 4A depicts a DC cross-section of an I-MEMS switch 400 in accordance with the present invention. Depicted in FIG. 4A, a DC signal is passed from the DC contact 420 through an anchor point 422 and into the DC cantilever structure 424. In the cross-sectional view of FIG. 4A, a portion of a metal dimple 416 (shown in FIG. 4B) would be seen in the background if the RF portion of the switch 400 were shown. A substrate bias electrode 426 is positioned on the substrate 114. As a DC bias is applied to the DC contact 420 and the substrate bias electrode 426, the DC cantilever structure 424 is pulled toward the substrate 114. FIGS. 4C and 4D depict the switch of FIGS. 4A and 4B, respectively, in a closed position.

In order to minimize the contact between the portion of the armature proximate a cantilever bias electrode 450 and the substrate bias electrode 426 when the switch 400 is closed, a set of teeth 470 is provided, formed in the first structure layer of the armature. Furthermore, a common ground layer 472 formed under a dielectric layer 474 provides a common ground contact through vias 476 to the anchor electrode 452 through a dielectric layer 474.

FIG. 4B depicts the RF cross-section of switch 400. The RF-input transmission line 410 passes through anchor point 414 and into the RF cantilever structure 415. Upon contact, the metal dimple 416 allows electricity to passes through the RF cantilever structure 415. The metal dimple 416 also provides an electrical contact between the RF-input transmission line 410 and the RF-output transmission line 412 when the switch is in a closed position. As discussed above, when a DC bias is applied to the DC contact 420 and the substrate bias electrode 426, the DC cantilever structure 424 is pulled toward the substrate 114. The deflection of the DC cantilever structure 424 toward the substrate 114 also causes the RF cantilever structure 415 to bend toward the substrate 114, providing an electrical path between the RF-input transmission line 410 and the RF-output transmission line 412.

In the I-MEMS switch (see FIGS. 4A–4D), the gap between the RF-output transmission line 412 and the metal dimple 416 is smaller than the gap between the substrate bias electrode 426 and the cantilever bias electrode in the armature 424. When actuated by electrostatic attraction, the armature structure, comprising the DC cantilever structure 424 and the RF cantilever structure 415, bends towards the substrate 114. First, the metal dimple 416 on the RF cantilever structure 415 contacts the RF transmission line 416, at which point the armature bends to allow the DC cantilever structure 424 to physically contact the substrate bias electrode 426. This fully closed state is shown in FIGS. 4C and 4D. The force of the metallic contact between the RF transmission line 412 and the metal dimple 416 is thus dependent on the spring constant force at the RF transmission line 412 when the switch is closed. Existing metallic switches that do not have contact dimples have contacts that depend upon the whole armature flexibility and bias strength. It is considered that this type of metal contact T-switch is less reliable than the micro-relay switches with dimple contacts such as those taught by the present invention. In addition to improving the switch reliability, the quality of the contact itself is improved by the dimple because the dimple has controllable geometric features such as size (area and height) and shape. Thus, MEMS switches without the dimple contact are more likely to have time-varying contact characteristics, a feature that may make them difficult or impossible to use in some circuit implementations.

Finally, although the top dimple electrode 416 is shown in a desirable manner that provides a locking mechanism, sandwiching a layer of the armature therein, it should be appreciated by one of skill in the art that the particular top dimple electrode configuration used is not critical, and therefore any known or future configuration may be used.

FIG. 5A depicts a cross-section of a doubly supported cantilever beam MEMS switch 500. An RF-input transmission line 510 is included in a cantilever beam 512. An RF-output transmission line 514 is located on a substrate 114. The cantilever beam 512, unlike the switches previously discussed, is attached with the substrate 114 at two ends. The cantilever beam 512 also includes a cantilever bias electrode 516. A substrate bias electrode 518 is located on the substrate 114. When a DC bias is applied to the cantilever bias electrode 516 and the substrate bias electrode 518, the cantilever beam 512 moves from the open position, shown in FIG. 5A to a closed position, shown in FIG. 5B. In the closed position, an electrical path is created between the RF-input transmission line 510 and the RF-output transmission line 514. Note that rather than passing along the beam, the RF signal could also be passed from an RF-input transmission line to an RF-output transmission line by using a line with a pair of dimples.

In order to minimize the contact between the portion of the armature proximate the cantilever bias electrode 516 and the substrate bias electrode 518 when the switch 500 is closed, a set of teeth 570 is provided, formed in the first structure layer of the armature. Furthermore, a common ground layer 572 formed under a dielectric layer 574 provides a common ground contact through vias 576 to the anchor electrode 552 through a dielectric layer 574.

As discussed above, the prior art T-MEMS switches have dimples attached with the armature. Because the formation of the dimple in the armature requires a highly sensitive, time-controlled etching process, the yield and performance of the MEMS switches will vary from lot to lot. However, with the design disclosed herein, by placing metal platforms on the input and output RF electrodes that are protruded from the substrate (instead of having a deep dimple on the armature), the yield and performance of MEMS switch fabrication is increased. A few of the potential applications of these MEMS switches are in the RF, microwave, and millimeter wave circuits, and wireless communications spaces. For example, these MEMS switches can be used in commercial satellites, antenna phase shifters for beam-steering, and multi-band and diversity antennas for wireless cell phones and wireless local area networks (WLANS).

Finally, although the top dimple electrode 580 is shown in a desirable manner that provides a locking mechanism, sandwiching a layer of the armature therein, it should be appreciated by one of skill in the art that the particular top dimple electrode configuration used is not critical, and therefore any known or future configuration may be used.

The following is an exemplary set of operations that may be used in the manufacturing of the device disclosed herein. One skilled in the art will appreciate that the acts outlined are to assist in incidating changes from the prior art manufacturing process, and are not intended to be a complete list of all acts used in the process. One skilled in the art will appreciate that the MEMS switches may have varying designs, such as I configurations and T configurations. However, the manufacturing acts disclosed herein are for the formation of a fabrication method for making a reliable microrelay MEMS switch on a substrate, which may be utilized in any MEMS switch configuration. The manufacturing process is described using the terminology for the I configuration as an illustration, however, those of skill in the art will realize that the acts presented are readily adaptable for other switch types.

FIG. 6 depicts a substrate. As shown in FIG. 6A, a common ground plane layer 600 is deposited on a substrate 602. In particular, to complete the device to the point shown in FIG. 6A, first a ground plane photoresist pattern is deposited on the substrate. Second, the common ground plane layer 600, of a conductive material, is deposited over the ground plane photoresist pattern and portions of the substrate 602. Next, the ground plane photoresist is removed, leaving the finished ground plane layer 600.

Next, as shown in FIG. 6B, a dielectric layer (typically $Si_3N_4$) 604 having a thickness and an area is deposited on over the common ground plane layer 600 and a portion of the substrate 602. The deposition of the dielectric layer 604 is typically by by Plasma Enhanced Chemical Vapor Deposition (PECVD) or by Low Pressure Chemical Vapor Deposition (LPCVD).

As shown in FIG. 6C, next, a DC via 606 is formed through the dielectric layer 604 to the common ground plane layer 600. To complete the device to the point shown in FIG. 6C, starting with the structure shown in FIG. 6B, first a DC via photoresist pattern is deposited onto the dielectric layer 604. Next, an etch process is used to form the DC via 606 through the dielectric layer 604 to the common ground plane layer 600. Finally, the DC via photoresist pattern is removed, leaving the DC via 606.

FIG. 6D presents the device shown in FIG. 6C, where the DC via 606 is filled to form a filled DC via 608. As can be appreciated by one of skill in the art, the DC via 606 may be filled either at this point, or later during the formation of the DC electrodes with the same result.

FIG. 6E depicts the device of FIG. 6D with the addition of a substrate electrode region photoresist pattern 610. To form the substrate electrode photoresist pattern 610, first a photoresist layer is formed and then areas of the photoresist layer are removed (typically by etching) to create the pattern.

After the substrate electrode photoresist pattern 610 has been deposited, next a conductive material (metal) layer is deposited into the substrate electrode photoresist pattern 610, resulting in the planarized configuration shown in FIG. 6F, having DC electrodes 614 and 614b, and RF electrode 614c. Note that although three electrodes are presented here, in the combination of two DC electrodes and one RF electrode, the present invention is not limited to this configuration and that any combination of electrodes may be produced, as necessitated by a particular application of the process.

At this point, the common ground has been formed. This technique can be extended to any device requiring such a common ground, and is not limited to use with the acts described below.

Figure 6G:
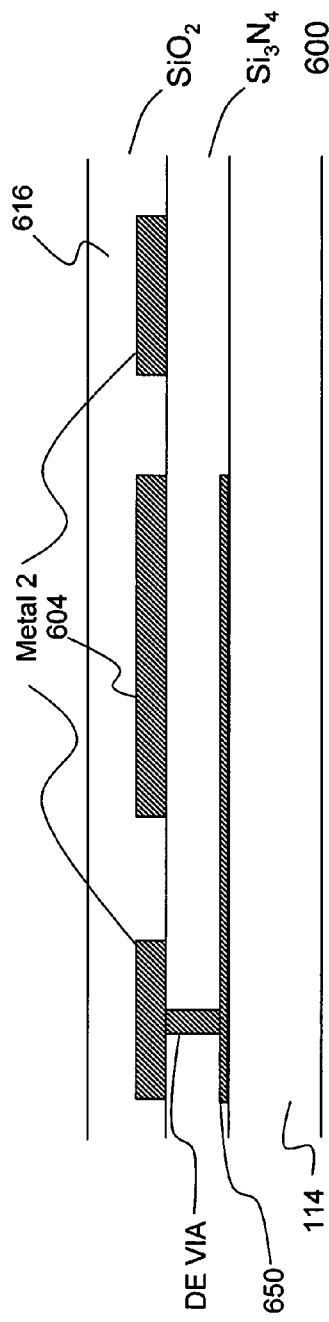
FIGS. 6A through 6P are side-views of a T-MEMS switch of the present invention, showing the switch at various stages of production.

After the common ground has been completed, a sacrificial layer 616 is deposited on the device, as shown in FIG. 6G.

Figure 6H:
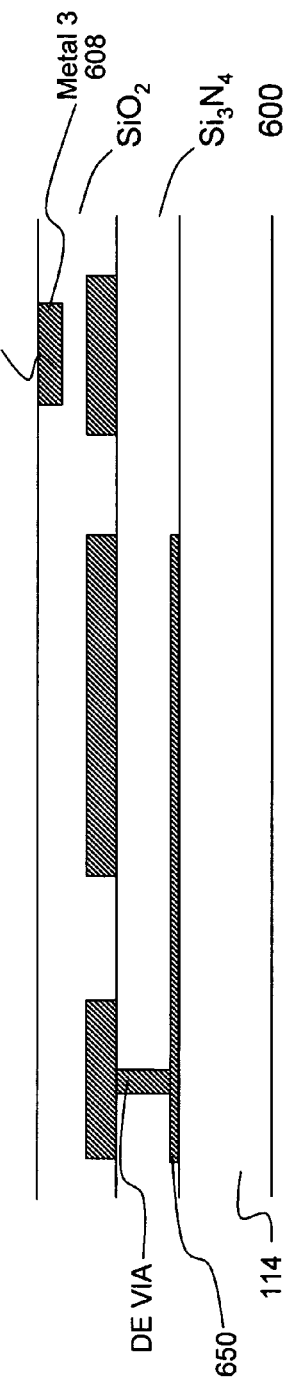
Figure 6I:
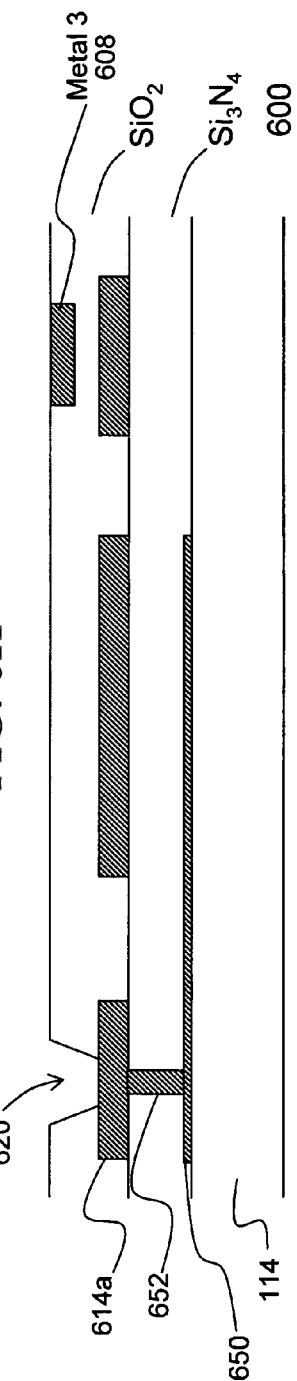

Next, a top electrode 618 is formed in the sacrificial layer 616, as shown in FIG. 6H. The formation of the top electrode 618 is accomplished by first etching a top electrode site in the sacrificial layer 616, and filling the top electrode site with conductive material to form the top electrode 618.

After the top electrode has been completed, an anchor site 620 is formed in the sacrificial layer 616. To do so, first an anchor site photoresist pattern is formed on the sacrificial layer 616. Next, an etch is made through the anchor site photoresist pattern to an electrode region 614a. Then, the anchor site photoresist pattern is removed. This results in the structure shown in FIG. 6I.

Next, as shown in FIG. 6J, a set of tooth regions 624 into the sacrificial layer 616 proximate a DC electrode 626. As will be appreciated by one of skill in the art, acts performed on a single layer such as those depicted in FIGS. 6H–J may be performed various orders depending on the particular needs of a specific process. To a similar extent, the order of the acts shown in all of FIG. 6 may be varied without departing from the scope of the present invention. Note also that the formation of the tooth regions 624 and subsequent acts regarding the teeth may be performed separately from other acts in this method, and thus are applicable to any device where minimal adhesion is desired.

Next, to form the device shown in FIG. 6K, a first insulating structure layer 628 is formed on the sacrificial layer 616. Also, although critical only to the generation of the particular electrode-type shown, a top electrode via 630 is formed in the sacrificial layer 616. Typically, the area of the anchor site 620 and an area of the top electrode 618 are masked with photoresist prior to the deposition of the first insulating structure layer 628, and then the photoresist is removed, leaving the structure of FIG. 6K.

FIG. 6L shows the device of FIG. 6K with the addition of a conductive material into the top electrode via 630, forming a filled top electrode via 632. The filling of the top electrode via 630 is typically accomplished by masking the surrounding area with a photoresist layer, filling the top electrode via 630, and removing the photoresist layer, leaving the filled top electrode via 632.

After the top electrode via 630 has been filled, next, a device separation photoresist pattern 634 is deposited over portions of the insulating first structure layer 628 where metal deposition is undesirable. This provides for electrical separation of desired areas of the electromechanical device and for the separation of desired devices. Next, a conducting second structure layer 636 is deposited. Note that as shown, the conducting second structure layer 636 contacts with the electrode region 614a through the anchor site 620 and with the filled top electrode via 632, resulting in the device shown in FIG. 6M.

Subsequently, the device separation photoresist pattern 634 is removed and a third insulating structure layer 638 having an area is deposited across the substrate area. Although not shown, additional acts are performed to complete the device separation. First, a device shape photoresist pattern is deposited across the substrate area, with the device shape photoresist pattern defining desired device shapes by selective exposure. Next, a selective etch is performed through exposed portions of the insulating first structure layer and the insulating third structure layer to isolate an electromechanical device having a desired shape. Finally, the device shape photoresist pattern is removed, resulting in the device shown in FIG. 6N.

Figure 6N:
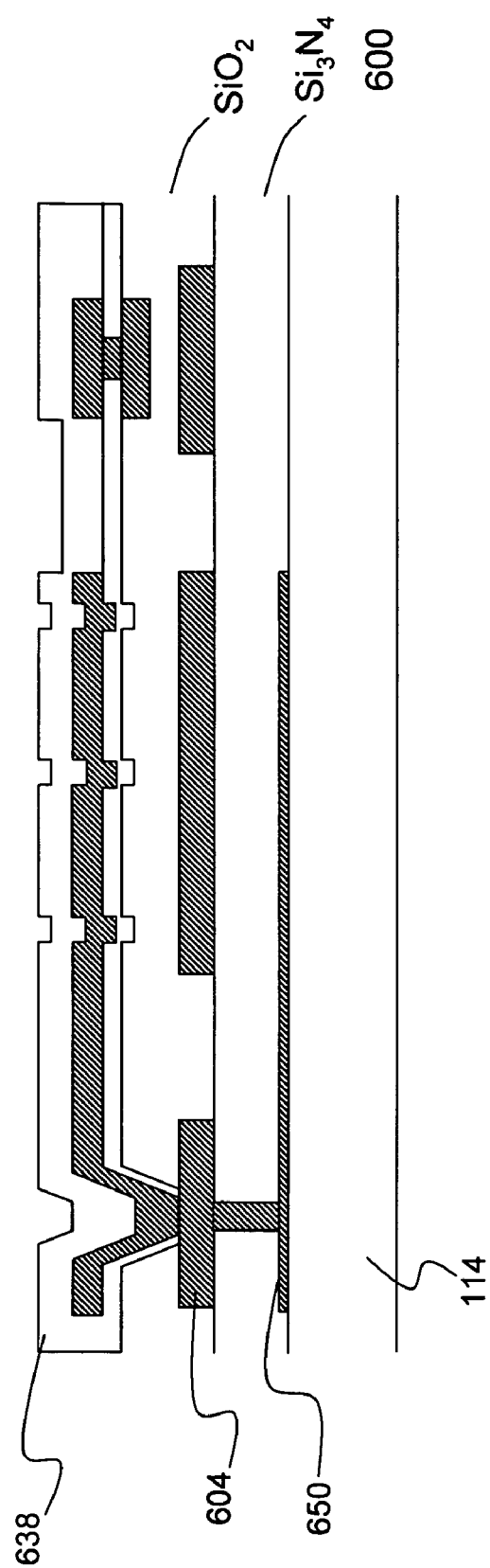
Figure 60:
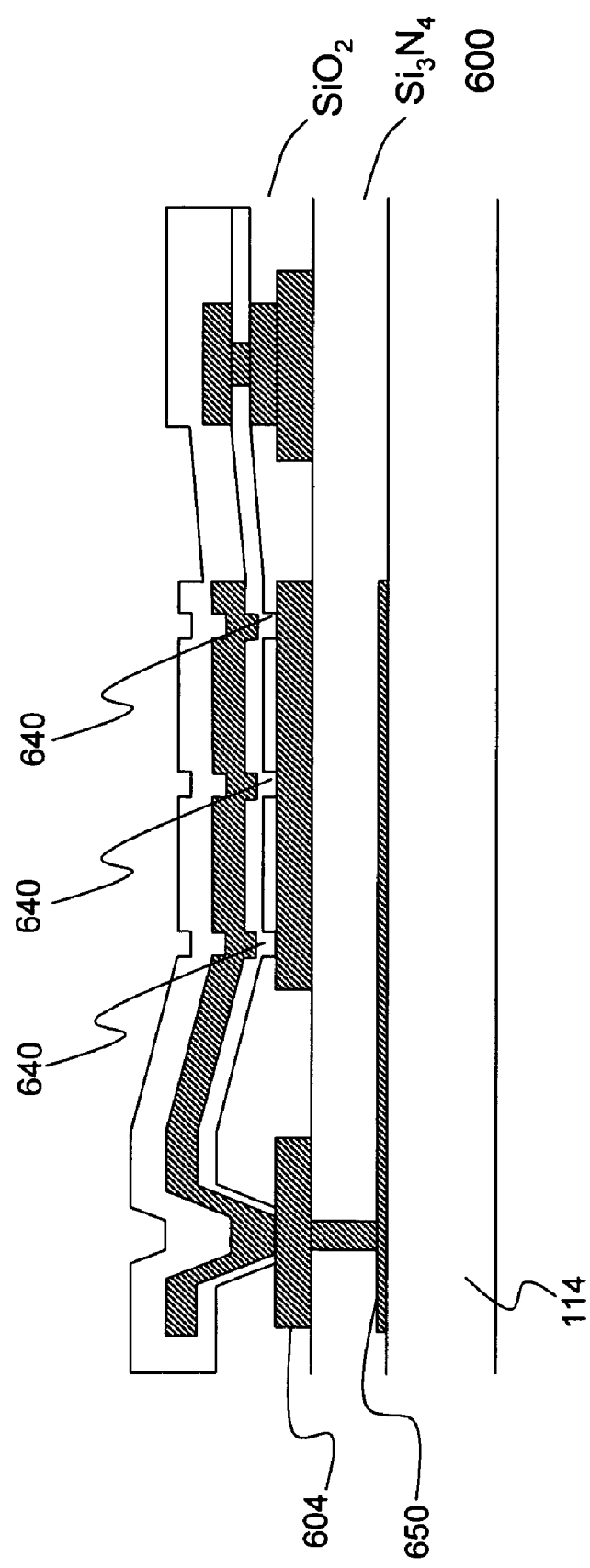

FIG. 6O shows the device of FIG. 6N in a "closed" position, where the teeth 640 minimize the contact in the area of the substrate electrode 614b.

Figure 6P:
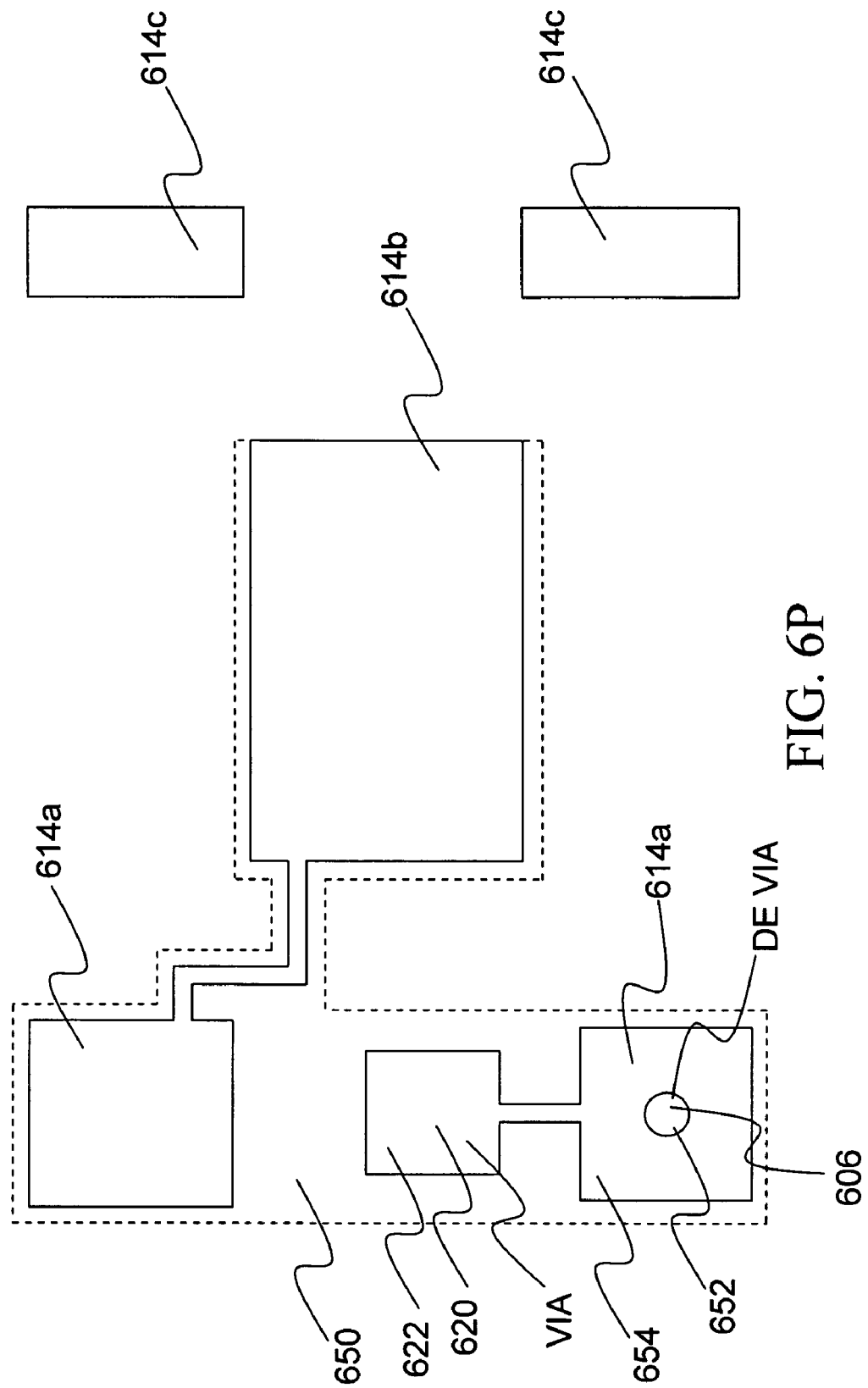

FIG. 6P shows a top view of the switch of FIGS. 6O and 6N without the armature. The common ground layer 600 can be seen extending under the DC electrodes 614a and 614b as well as under the DC via 606. Also, it is noteworthy that the RF electrodes 614c are not within the perimeter of the common ground layer 600.

It is important to note that the set of tooth regions 624 may be formed either on the armature region of a switch, as shown in FIG. 6 or protruding from the substrate region or a bottom electrode. Further, depending on the layer structure of a particular device, the tooth regions 624 may be formed as part of an insulating layer, a conducting layer, or any combination of layers without departing from the scope of the present invention. Regardless of the geometric location, the configuration, or the material structure of the tooth regions 624, their purpose is for the reduction of the adhesion area at a place where one portion of a device contacts another portion of a device (regardless whether the other portion is even of the same device).

In one aspect, the chip size containing the MEMS switch, such as those taught herein is 800×400 microns. The metal electrode pad is on the order of 100×100 microns. The actuation pad may vary from 100-20×100-20 microns depending upon the design of the specific actuation voltage.

The RF line may vary between 50–200 microns wide. The above dimensions are provided as exemplary and are not intended to be construed as limiting. Instead, one skilled in the art will appreciate that different dimensions may be used depending upon the size of the MEMS switch being designed and the application for which it is being used. Furthermore, a table is presented in FIG. 7, providing non-limiting examples of materials, deposition processes (where applicable), removal processes (where applicable), etch processes (where applicable), and thickness ranges for the various layers that make up a MEMS switch according to the present invention. It is important that this table be considered simply as a general guide and that it be realized that the present invention may use other materials, deposit processes, removal processes, etch processes, and thicknesses than those described and that the information provided in FIG. 7 is intended simply to assist the reader in gaining a better general understanding of the present invention.

Figure 8:
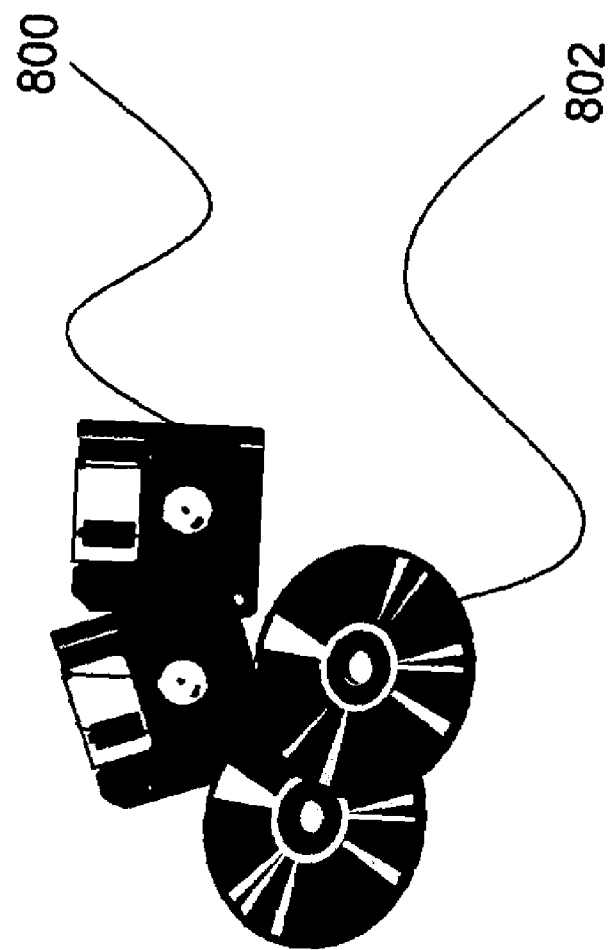
FIG. 8 is an illustrative diagram of a computer program product aspect of the present invention.

As stated previously, the operations performed by the present invention may be encoded as a computer program product. The computer program product generally represents computer readable code stored on a computer readable medium such as an optical storage device, e.g., a compact disc (CD) or digital versatile disc (DVD), or a magnetic storage device such as a floppy disk or magnetic tape. Other, non-limiting examples of computer readable media include hard disks, read only memory (ROM), and flash-type memories. An illustrative diagram of a computer program product embodying the present invention is depicted in FIG. 8. The computer program product is depicted as a magnetic disk 800 or an optical disk 802 such as a CD or DVD. However, as mentioned previously, the computer program product generally represents computer readable code stored on any desirable computer readable medium.

Figure 9:
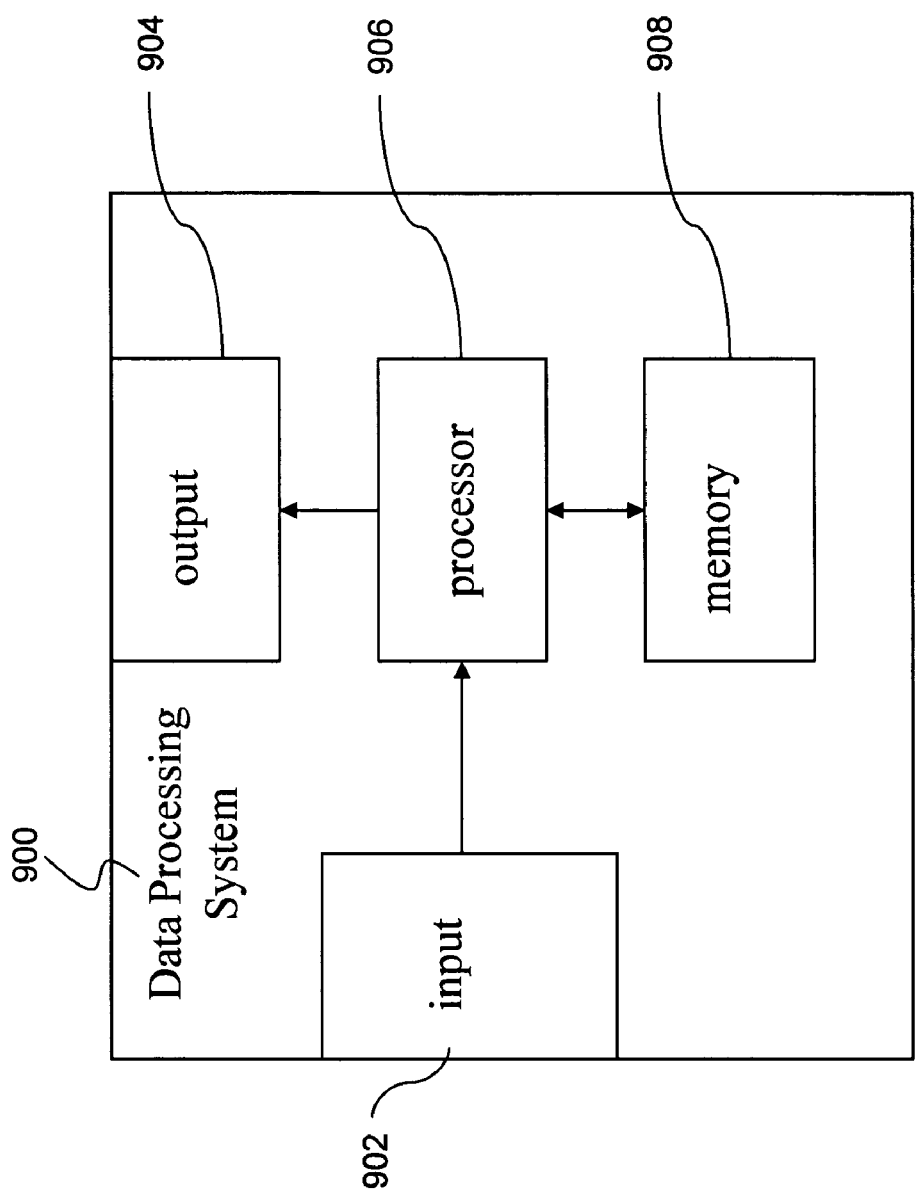
FIG. 9 is a block diagram of a data processing system used in conjunction with the present invention.

When loaded onto a semiconductor process control computer as shown in FIG. 9, the computer instructions from the computer program product provides the information necessary to cause the computer to perform the operations/acts described with respect to the method above, resulting in a device according to the present invention.

A block diagram depicting the components of a computer system that may be used in conjunction with the present invention is provided in FIG. 9. The data processing system 900 comprises an input 902 for receiving information from at least a computer program product or from a user. Note that the input 902 may include multiple "ports." The output 904 is connected with a processor 906 for providing information regarding operations to be performed to various semiconductor processing machines/devices. Output may also be provided to other devices or other programs, e.g. to other software modules for use therein or to display devices for display thereon. The input 902 and the output 904 are both coupled with the processor 906, which may be a general-purpose computer processor or a specialized processor designed specifically for use with the present invention. The processor 906 is coupled with a memory 908 to permit storage of data and software to be manipulated by commands to the processor.

What is claimed is:

1. A method for forming a common ground for an microelectromechanical device comprising acts of:
   patterning a common ground plane layer on a substrate;
   forming a dielectric layer on the common ground plane layer;
   depositing a DC electrode region through the dielectric layer to contact the common ground plane layer; and
   depositing a conducting layer on the DC electrode region so that regions of the conducting layer contact the DC electrode region, so that the common ground plane layer provides a common ground electrical contact for the regions of the conducting layer, wherein the method for forming the common ground for the microelectromechanical device further comprising acts of
   depositing a sacrificial layer on the dielectric layer and the conducting layer, the sacrificial layer having a thickness; and
   etching a plurality of tooth regions into the sacrificial layer proximate a portion of the conducting layer, such that the tooth regions, in a final device, provide a reduced adhesion area when the device closes.

2. A method for forming a common ground for an microelectromechanical device as set forth in claim 1, wherein the act of patterning a common ground plane layer on a substrate further comprises acts of:
   depositing a ground plane photoresist pattern to form a common ground plane layer on at least a portion of a substrate having a substrate area;
   depositing the common ground plane layer into the ground plane photoresist pattern; and
   removing the ground plane photoresist pattern.

3. A method for forming a common ground for an microelectromechanical device as set forth in claim 2, wherein the act of forming a dielectric layer on the common ground plane layer further comprises acts of:
   depositing a dielectric layer having a thickness and an area on the common ground plane layer;
   depositing a DC via photoresist pattern on the dielectric layer, patterned to leave a DC electrode via exposed;
   etching through the thickness of a portion of the area of the dielectric layer at the DC electrode via to form a DC via in the dielectric layer, where the DC via connects with the common ground plane layer; and
   removing the DC via photoresist pattern.

4. A method for forming a common ground for an microelectromechanical device as set forth in claim 3, wherein the act of depositing a conducting layer on the DC electrode region so that regions of the conducting layer contact the DC electrode region, so that the common ground plane layer provides a common ground for the regions of the conducting layer further comprises acts of:
   depositing a DC electrode region photoresist pattern;
   depositing a conducting layer on the DC electrode region photoresist pattern and dielectric layer to form a set of DC electrodes in the set of DC electrode regions, where a DC electrode is in contact with the common ground plane layer through the DC via; and
   removing the DC electrode region photoresist pattern.

5. A method for forming a common ground for an microelectromechanical device as set forth in claim 4, further comprising acts of:
   depositing a sacrificial layer over the conducting layer;
   depositing an anchor site photoresist pattern to provide for an anchor site;
   etching through the sacrificial layer to expose a portion of the conducting layer at a DC electrode region to form an anchor site;
   removing the anchor site photoresist pattern;
   depositing an insulating first structure layer on the sacrificial layer and the anchor site, the insulating first structure layer having an area;
   depositing a top electrode photoresist pattern for etching through the anchor site for providing contact to the conducting layer and for forming a top electrode;

etching through the insulating first structure layer across at least a portion of the anchor site so that a portion of the conducting layer is exposed, and etching through the insulating first structure layer and through a portion of the thickness of the sacrificial layer at a top electrode site so that a top electrode space is defined through the insulating first structure layer, and into the sacrificial layer, proximate an electrode region;

removing the top electrode photoresist pattern;

depositing a device separation photoresist pattern on the insulating first structure layer, the device separation photoresist pattern forming separation regions for electrically separating desired areas of the microelectromechanical device and for separating desired devices;

depositing a conducting second structure layer on the insulating first structure layer, the exposed portion of the conducting layer, and in the top electrode space, the conducting second structure layer having an area;

removing the device separation photoresist pattern to eliminate unwanted portions of the conducting second structure layer in order to electrically separate desired areas of the microelectromechanical device and for separating desired devices;

depositing an insulating third structure layer on the microelectromechanical device, across the substrate area, the insulating third structure layer having an area;

depositing a device shape photoresist pattern on the microelectromechanical device, across the substrate area, with the device shape photoresist pattern defining desired device shapes by selective exposure;

selectively etching through exposed portions of the insulating first structure layer and the insulating third structure layer to isolate an microelectromechanical device having a desired shape; and removing the device shape photoresist pattern.

6. A method for forming a common ground for an microelectromechanical device as set forth in claim 1, wherein the act of forming a dielectric layer on the common ground plane layer further comprises acts of:

depositing a dielectric layer having a thickness and an area on the common ground plane layer;

depositing a DC via photoresist pattern on the dielectric layer, patterned to leave a DC electrode via exposed;

etching through the thickness of a portion of the area of the dielectric layer at the DC electrode via to form a DC via in the dielectric layer, where the DC via connects with the common ground plane layer; and removing the DC via photoresist pattern.

7. A method for forming a common ground for an microelectromechanical device as set forth in claim 1, wherein the act of depositing a conducting layer on the DC electrode region so that regions of the conducting layer contact the DC electrode region, so that the common ground plane layer provides a common ground for the regions of the conducting layer further comprises acts of:

forming a DC electrode in a set of DC electrode regions, where a DC electrode is in contact with the common ground plane layer through the a DC via.

* * * * *

UNITED STATES PATENT AND TRADEMARK OFFICE
CERTIFICATE OF CORRECTION

PATENT NO. : 7,101,724 B2
APPLICATION NO. : 10/994703
DATED : September 5, 2006
INVENTOR(S) : Chia-Shing Chou It is certified that error appears in the above-identified patent and that said Letters Patent is hereby corrected as shown below:

Title page and Col. 1
Title reading "METHOD OF FABRICATING SEMICONDUCTOR DEVICES EMPLOYING AT LEAST ONE MODULATION DOPED QUANTUM WELL STRUCTURE AND ONE OR MORE ETCH STOP LAYERS FOR ACCURATE CONTACT FORMATION" should be changed to --MICROELECTROMECHANICAL DEVICE HAVING A COMMON GROUND PLANE LAYER AND A SET OF CONTACT TEETH AND METHOD FOR MAKING THE SAME--.

In claim 7, line 10, cancel the text "the".

Signed and Sealed this

Sixth Day of March, 2007

JON W. DUDAS
*Director of the United States Patent and Trademark Office*